(12) United States Patent
Tan et al.

(10) Patent No.: US 9,728,721 B2
(45) Date of Patent: Aug. 8, 2017

(54) RESISTIVE MEMORY DEVICE

(71) Applicant: GLOBALFOUNDRIES Singapore Pte. Ltd., Singapore (SG)

(72) Inventors: Shyue Seng Tan, Singapore (SG); Eng Huat Toh, Singapore (SG); Xuan Anh Tran, Singapore (SG); Yuan Sun, Singapore (SG); Elgin Kiok Boone Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 69 days.

(21) Appl. No.: 14/340,582

(22) Filed: Jul. 25, 2014

(65) Prior Publication Data
US 2016/0028009 A1 Jan. 28, 2016

(51) Int. Cl.
*H01L 45/00* (2006.01)
*H01L 27/24* (2006.01)

(52) U.S. Cl.
CPC .......... *H01L 45/16* (2013.01); *H01L 27/2436* (2013.01); *H01L 45/04* (2013.01); *H01L 45/06* (2013.01); *H01L 45/122* (2013.01); *H01L 45/144* (2013.01); *H01L 45/146* (2013.01)

(58) Field of Classification Search
CPC ............. H01L 27/2472; H01L 27/0203; H01L 27/24; H01L 27/2436; H01L 27/2463; H01L 27/285; H01L 45/04
USPC ......................................................... 257/1–5
See application file for complete search history.

(56) References Cited

U.S. PATENT DOCUMENTS

| | | | | |
|---|---|---|---|---|
| 2011/0260158 | A1* | 10/2011 | Takemura | G11C 11/404 257/43 |
| 2012/0211717 | A1* | 8/2012 | Kinoshita | H01L 45/06 257/2 |
| 2012/0243307 | A1* | 9/2012 | Takashima | H01L 27/2436 365/163 |
| 2012/0268980 | A1* | 10/2012 | Awaya | G11C 13/0007 365/148 |
| 2013/0126816 | A1* | 5/2013 | Tang | H01L 27/2463 257/3 |
| 2013/0234088 | A1* | 9/2013 | Nishi | H01L 45/08 257/1 |
| 2014/0056071 | A1* | 2/2014 | Choi | G11C 5/02 365/185.11 |

(Continued)

OTHER PUBLICATIONS

International Technology Roadmap for Semiconductors, Process Integration, Devices, and Structures, 2009, pp. 1-24, The International Technology Roadmap for Semiconductors.

(Continued)

*Primary Examiner* — Mohsen Ahmadi
*Assistant Examiner* — David Spalla
(74) *Attorney, Agent, or Firm* — Horizon IP Pte Ltd.

(57) ABSTRACT

A non-volatile memory device and a manufacturing method thereof are provided. The memory device includes a substrate, a lower cell dielectric layer with gate conductors and a body unit conductor disposed on the lower cell dielectric layer and gates. Memory element conductors are disposed on the body unit and lower cell dielectric layer. An upper cell dielectric layer may be on the substrate and over the lower cell dielectric layer, body unit conductor and memory element conductors. The upper cell dielectric layer isolates the memory element conductors.

22 Claims, 26 Drawing Sheets

(56) References Cited

U.S. PATENT DOCUMENTS

2014/0097398 A1* 4/2014 Cho .................. H01L 27/101
                                                                                                                                       257/4

OTHER PUBLICATIONS

Pi-Feng Chiu et al., A Low Store Energy, Low VDDmin, Nonvolatile 8T2R SRAM with 3D Stacked RRAM Devices for Low Power Mobile Applications, Symposium on VLSI Circuits/Technical Digest of Technical Papers, 2010, pp. 229-230, IEEE.

Y. Sasago et al., Phase-change memory driven by poly-Si MOS transistor with low cost and high-programming gigabyte-per-second throughput, Symposium on VLSI Technology Digest of Technical Papers, 2011, pp. 96-97.

A. Pirovano et al., Scaling Analysis of Phase-Change Memory Technology, IEEE, 2003.

Yuan Heng Tseng et al., High Density and Ultra Small Cell Size of Contact ReRAM (CR-RAM) in 90nm CMOS Logic Technology and Circuits, IEDM09, 2009, pp. 109-112, IEEE.

* cited by examiner

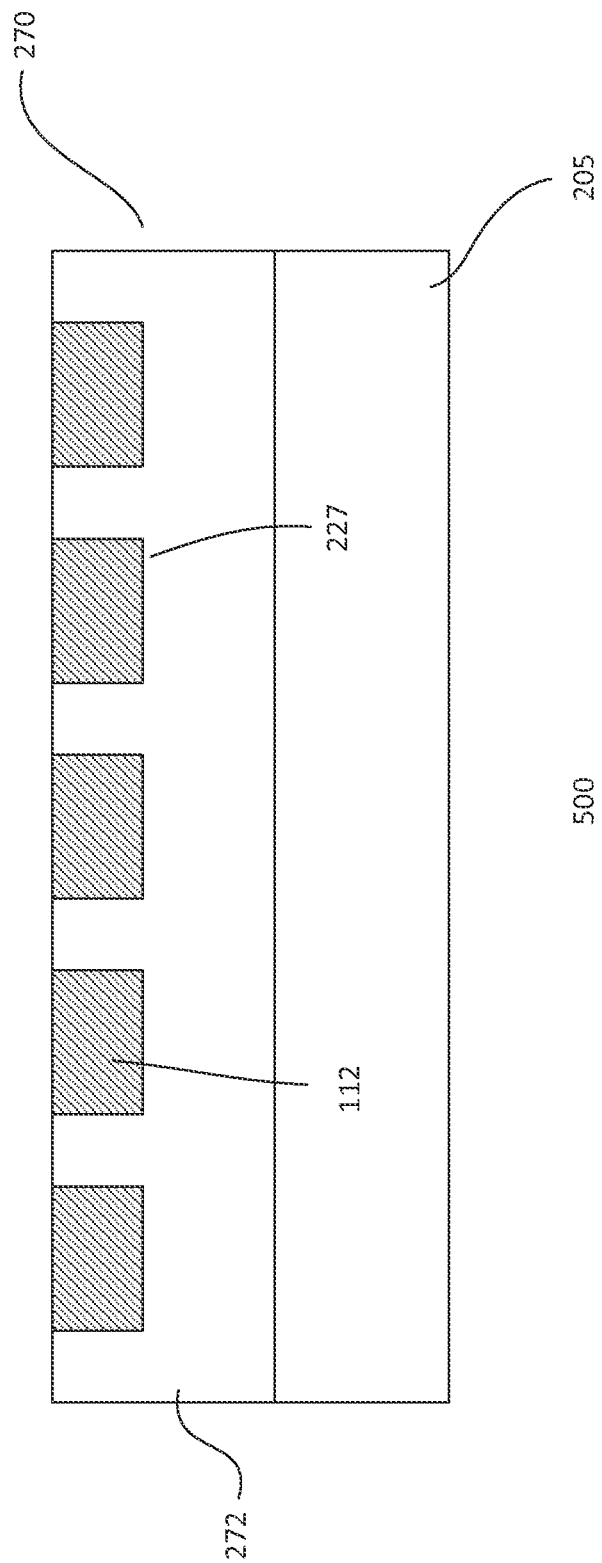

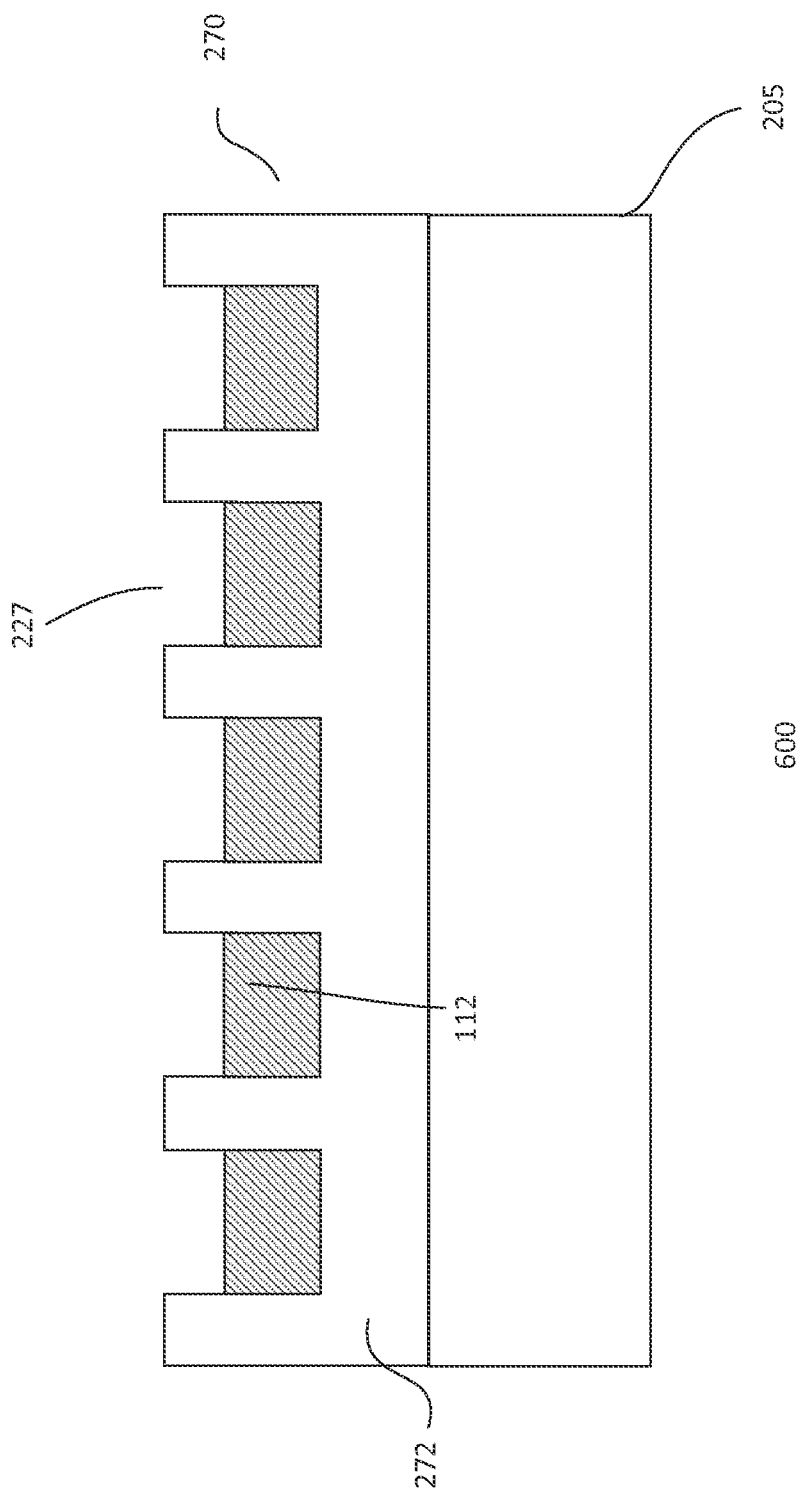

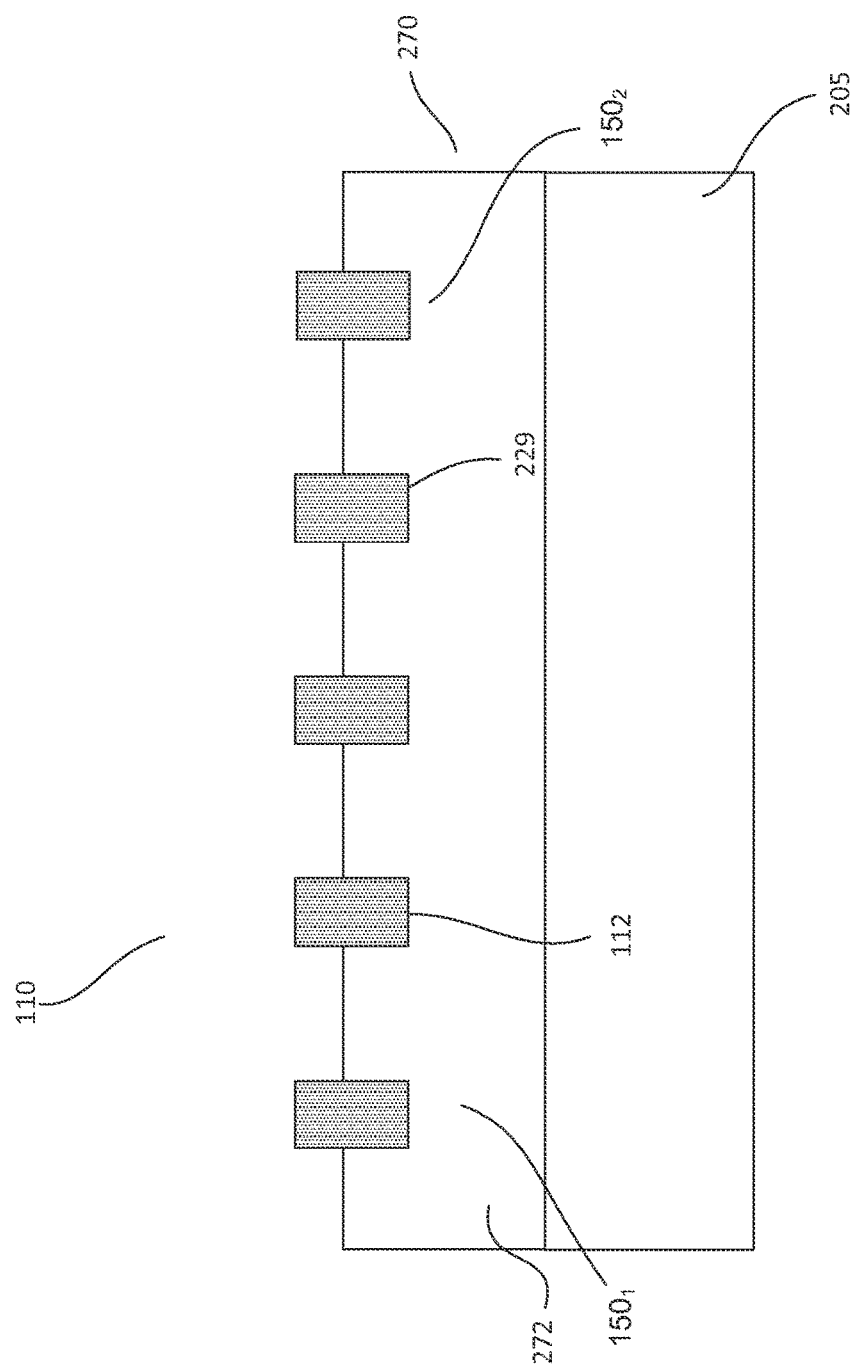

RESISTIVE MEMORY DEVICE

BACKGROUND

Resistive-type non-volatile memories (NVMs), such as phase change random access memories (PCRAMs) and resistive RAMs (RRAMs), employ memory elements having different stable resistive states. Such resistive elements enable data corresponding to the different resistive states to be stored. For PCRAMs, the memory element switches between the amorphous and crystalline phases. Switching between the two phases is achieved by heating the memory element using a heater. As for RRAMs, the memory element switches between the insulating and conducting phases by creating or destroying conductive filaments.

The NVMs may be configured in a NAND configuration. In a NAND NVM, the memory element is coupled in parallel with a cell selector, such as a transistor. Conventional NAND configured NVMs suffer from drawbacks, such as disturbances from neighboring cells, hindering scalability. Additionally, NAND configured NVMs incur high power consumption due to high leakage current through the memory elements.

In view of the foregoing, there is a desire to provide a scalable non-volatile memory structure with low power consumption.

SUMMARY

Embodiments generally relate to semiconductor devices and methods of forming a semiconductor device. In one embodiment, a method of forming a memory cell is disclosed. The method includes providing a substrate prepared with a lower cell dielectric layer with gate conductors disposed in a first direction. The gate conductors may separate the lower cell dielectric layer. A body unit conductor is formed on the lower cell dielectric layer and gates. The body unit conductor is disposed along a second direction and traverses the gates. Memory element conductors may be formed on the body unit and lower cell dielectric layer, along the first direction and over the gate conductors. An upper cell dielectric layer may be formed on the substrate to cover the lower cell dielectric layer, body unit conductor and memory element conductors. The upper cell dielectric layer isolates the memory element conductors.

In another embodiment, a device is disclosed. The device includes a substrate prepared with a lower cell dielectric layer with gate conductors disposed in a first direction. The gate conductor may separate the lower cell dielectric layer. A body unit conductor is disposed on the lower cell dielectric layer and gates. The body unit conductor may be along a second direction and may traverse the gates. Memory element conductors are disposed on the body unit and lower cell dielectric layer. The memory element conductors may be along over the gate conductors in the first direction. An upper cell dielectric layer may be on the substrate and over the lower cell dielectric layer, body unit conductor and memory element conductors. The upper cell dielectric layer isolates the memory element conductors.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following drawings, in which:

FIGS. 5a-5d show cross-sectional views of an embodiment of a process for forming a device of FIGS. 2a-2b;

FIGS. 6a-6d show cross-sectional views of an embodiment of a process for forming a device of FIGS. 3a-3b;

FIGS. 7a-7f show cross-sectional views of an embodiment of a process for forming a device of FIGS. 4a-4b.

DETAILED DESCRIPTION

Embodiments generally relate to semiconductor devices. More particularly, some embodiments relate to memory devices, such as non-volatile memory (NVM) devices. Such memory devices, for example, can be incorporated into standalone memory devices, such as USB or other types of portable storage units, or ICs, such as microcontrollers or system on chips (SoCs). Other types of ICs may also be useful. The devices or ICs can be incorporated into or used with, for example, consumer electronic products, or relate to other types of products.

Figure 1:
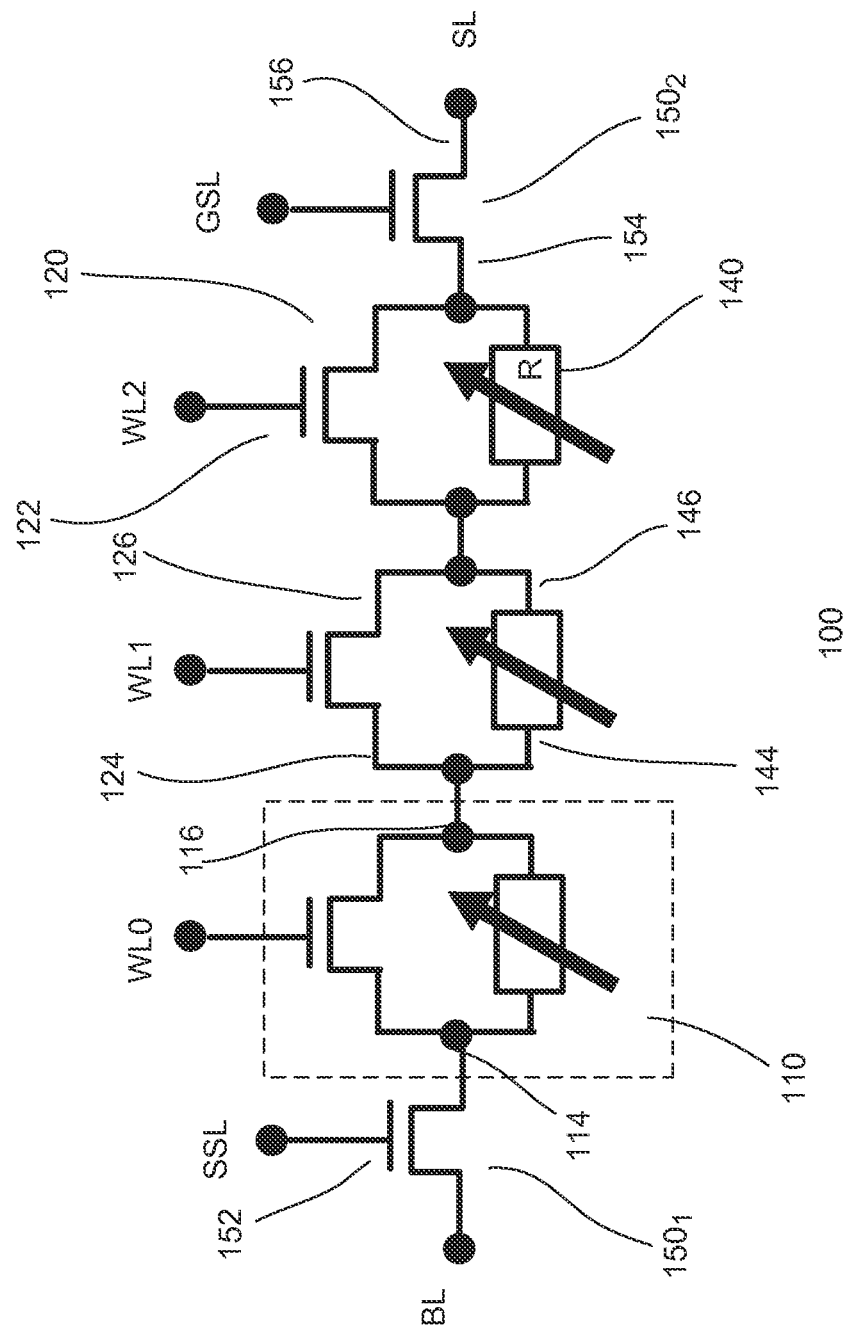
FIG. 1 shows schematic diagram of an embodiment of a device.

FIG. 1 shows a simplified schematic diagram of an embodiment of a device 100. The device includes a plurality of n memory cells 110. The memory cells, in one embodiment, are non-volatile memory (NVM) cells. Other types of memory cells may also be useful. A memory cell includes a cell selector 120 and a storage unit. The cell selector, in one embodiment, is a transistor, such as a metal oxide semiconductor (MOS) transistor. The transistor includes a gate terminal 122 and first and second transistor terminals 124 and 126. The first and second transistor terminals, for example, are source/drain (S/D) regions. For example, the S/D regions are heavily doped regions with first polarity type dopants. Metal silicide contacts may be disposed on the S/D regions. Other configurations of S/D regions may also be useful. In some embodiments, S/D regions may be the same as the transistor body. For example, the S/D regions may be doped with the same dopant type and concentration as the channel or transistor body.

A storage unit includes a storage element 140 with first and second storage terminals 144 and 146. In one embodiment, the storage element is a resistive element R. Other types of storage elements may also be useful. The resistive element is employed for storing information. The resistive element is a programmable resistive element. The programmable resistive element, for example, is a bi-stable resistive element having first and second stable resistive states. For example, the resistive element has a stable high resistive state and a stable low resistive state, with one corresponding to a logic "0" and the other corresponding to a logic "1". For example, the high resistive state may represent a logic 0 while the low resistive state may represent a logic 1. Having the high resistive state representing a logic 1 and the low resistive state representing a logic 0 may also be useful. Other configurations of data storage for the resistive element may also be useful.

In one embodiment, a resistive element is a thermal-based resistive element. A thermal-based resistive element includes a heater or heating element for changing the resistive element from one resistive state to another. In one embodiment, the thermal-based resistive element is a phase change (PC) resistive element to form a PCRAM. For example, the resistive element includes a PC material (PCM). The PCM, in one embodiment, is a chalcogenide material. In one embodiment, the chalcogenide material is a GeSbTe alloy. In one embodiment, the chalcogenide material is $Ge_2Sb_2Te_5$ (GST). Other types of chalcogenide or PCMs may also be employed. Other types of thermal-based resistive elements forming other types of RAMs may also be useful.

In other embodiments, the resistive element is a non-thermal based resistive element. For example, the programmable resistive element includes a resistive material, forming a ReRAM. The resistive material, for example, is a transitional metal oxide, such as titanium oxide ($TiO_x$), nickel oxide (NiOx), aluminum oxide (AlOx), hafnium oxide (HfOx), tungsten oxide (WOx), tantalum oxide (TaOx), vanadium oxide (VOx), and copper oxide (CuOx). Other types of programmable resistive materials may also be useful. A programmable resistive material is subjected to a forming procedure which creates conduction paths or filaments after it is formed. The filaments can be reset or broken by subjecting the programmable resistive material to a reset procedure or condition; the filaments can be set or re-formed by subjecting the programmable resistive material to a set procedure or condition. Once set or reset, the state of the resistor is stable until reset or set. A resistor with broken filaments is in a high resistive state while a reset resistor with re-formed filaments is in a low resistive state.

First and second storage electrodes may be disposed at first and second ends of the storage elements, forming first and second terminals of the storage units. The electrodes, for example, may be formed of an electrical connection material (ECM). The ECM is a conductive material. The type of ECM material may, for example, depend on the type of resistive element of the storage units. The electrode may be a composite electrode. For example, in the case of a PCM storage unit, the electrodes may be a composite electrode, including a heater. The heater may be a low conductive ECM, such as TiN while the electrode may be TaN. In some embodiments, the transistor body may serve as a heater. For such embodiments, electrodes may not be needed. However, it is understood that electrodes may be provided. In the case of a Re-RAM, the electrode may be an electrode stack, such as $TiON/SiO_2$, or a transition-metal oxide (TMO), such as HfO and ZrO. Other types of ECMs or configurations of electrodes may also be useful.

In one embodiment, the cell selector and storage element are coupled in parallel. For example, the first transistor or cell selector terminal is coupled to the first storage terminal; the second transistor terminal is coupled to the second storage terminal. The first transistor and first storage terminals form a first cell terminal 114 while the second transistor and second storage terminals form a second cell terminal 116. Coupling the storage element and cell selector in parallel forms a NAND type memory cell.

The n memory cells are coupled in series. For example, a second terminal of one memory cell is coupled to a first terminal of another memory cell. The memory cells may form a column of memory cells. As shown, a column includes 3 memory cells (e.g., n=3). Providing a column having other number of memory cells may also be useful.

In one embodiment, the column of memory cells is coupled between first and second column selectors $150_1$-$150_2$. The column selectors, for example, are transistors, such as MOS transistors. Other types of column selectors may also be useful. A transistor includes a gate terminal 152 and first and second column selector terminals 154 and 156. The terminals 154 and 156 are, for example, S/D terminals. The S/D terminals may be heavily doped with first polarity type dopants. Metal silicide contacts may be provided on the S/D terminals. Other configurations of S/D terminals may also be useful.

As shown, the first column selector's first terminal or drain region is coupled to a bitline BL and its gate is coupled to a SSL; the second column selector's second terminal or source region is coupled to a source line SL and its gate is coupled to a GSL. SSL and GSL refer to the lines coupled to the gates of the first and second column selectors. As for gates of the cell selectors, they are coupled to wordlines WLs. The cell selector of the $x^{th}$ cell of the column is coupled to a wordline WLx-1. For example, the first memory cell is coupled to WL0 while the last memory cell is coupled to WLx-1. In the case of 3 memory cells, the last memory cell of the column is coupled to WL2.

In one embodiment, at least the S/D terminals of the column selectors coupled to the BL and SL are heavily doped S/D regions. In some embodiments, the S/D terminals of the column selectors not coupled to BL and SL may be the same as the transistor body. For example, the S/D regions may be doped with the same dopant concentration as the channel or transistor body. Other configurations of S/D regions of the column selectors may also be useful.

Appropriate signals are provided on the BL, SSL, WLs, GSL and SL to access a memory cell of a column. For example, active column select signals are provided to the selected column. The active column select signals switch on the column selectors. The active column select signals switch on the cell selectors, providing connection from the selected BL to the SL. Non-active column select signals are provided to the column selectors of non-selected columns. This disconnects the BL and SL of non-selected columns. An active cell select signal is provided on the selected cell and inactive cell select signals are provided on the non-selected cells. The active select signal switches the cell selector of the selected cell off while the inactive select signal switches the cell selectors of the non-selected cells on. As such, current flows from the BL, through the cell selectors of the non-selected cells, through the storage element of the selected cell and to the SL.

Table 1a shows the various signals applied to the terminals of the memory cells, depending on the desired type of access or operation.

TABLE 1a

| | BL | | WL | | SSL/GSL | | |
|---|---|---|---|---|---|---|---|
| Operation | Sel. | Un-sel. | Sel | Un-sel. | Sel | Un-sel | SL |
| Forming | $V_{form}$ | Float | $V_{WL-sel}$ | $V_{WL-unsel}$ | $V_{SL-sel}$ | $V_{SL-unsel}$ | $V_S$ |
| Read | $V_{read}$ | Float | $V_{WL-sel}$ | $V_{WL-unsel}$ | $V_{SL-sel}$ | $V_{SL-unsel}$ | $V_S$ |
| Set | $V_{set}$ | Float | $V_{WL-sel}$ | $V_{WL-unsel}$ | $V_{SL-sel}$ | $V_{SL-unsel}$ | $V_S$ |
| Reset | $V_{reset}$ | Float | $V_{WL-sel}$ | $V_{WL-unsel}$ | $V_{SL-sel}$ | $V_{SL-unsel}$ | $V_S$ |

Table 1a shows the various signals applied to the terminals of the memory cells, depending on the desired type of access or operation. In the case of ReRAMs, a forming procedure is employed to initialize the memory cells. The values of the signal provided in Table 1a are exemplary and may depend on, for example, the technology. The various signals should be sufficient to achieve the objective, such as performing memory access (e.g., programming and reading). Furthermore, it is understood that the stimuli for setting and resetting is the current which is produced by the voltage pulses. The voltage pulses are provided to produce the desired SET and RESET currents. The SET and RESET currents may be about 10-100 μA to or less for 40 nm node. Other SET and RESET current values may also be useful. The RESET current typically is higher than the SET current. By using a filament heater in the storage dielectric, smaller current is needed to SET and RESET the storage element. As for the Read pulse, it may have a shorter duration, such as about 12-25 ns for a resistive element set at about 50-1000 ohms. Other Read pulse durations may also be useful. An initialization or forming voltage may be provided on the BL to form the filaments in the storage dielectric. The initialization voltage, for example, may be about 0.5-1V higher than the RESET voltage. Depending on the type or storage dielectric layer, other types of initialization voltages or processes may be performed. In some cases, no initialization process is needed.

In accordance with one embodiment, resistive elements of the memory cells within a column are isolated from each other. By providing isolated resistive elements, thermal disturb between cells in a column is reduced. This enables lower spacing between cells. High electric field crowds at the corner, resulting in current crowding. Current crowding at the corner improves reset efficiency and reduces current spreading issues. This improves performance as well as reliability.

A plurality of memory cells may be interconnected to form a memory array. For example, BLs and SLs form columns of memory cells while WLs, SSLs, and GSLs form rows of memory cells. Lines of the rows may be in a first direction and lines of the columns may be in a second direction. The first and second directions may be orthogonal. Arranging the memory cells in other configurations may also be useful.

Figure 2A:
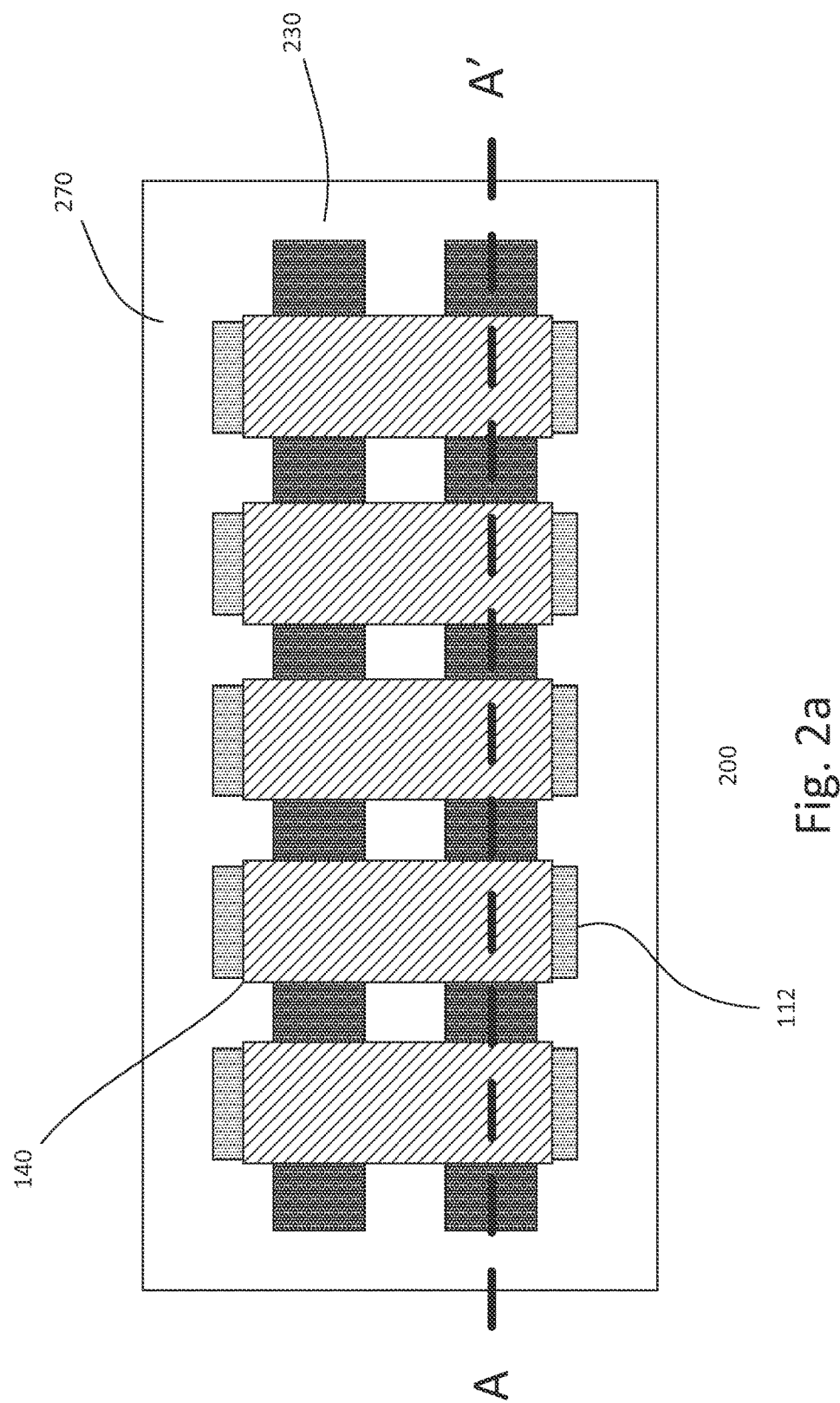
FIGS. 2a-2b show simplified plan and cross-sectional views of an embodiment of a device.
Figure 2B:
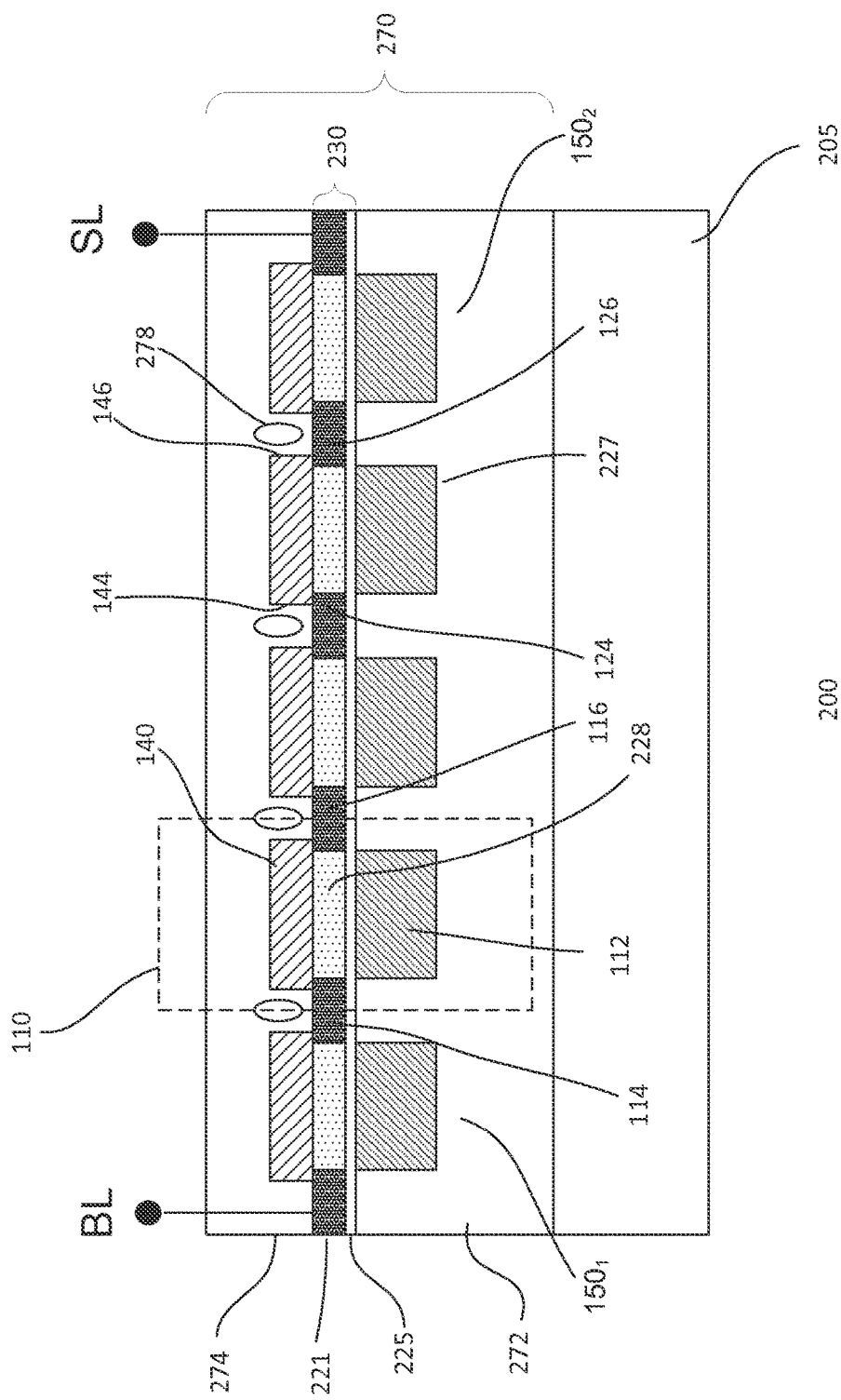

FIGS. 2a-2b show simplified plan and cross-sectional views of an embodiment of a device 200. The cross-sectional view is along A-A' which is along a second direction of the device. The second direction, for example, is along a bitline BL direction. The device includes a plurality of n memory cells 110. The memory cells, in one embodiment, are non-volatile memory (NVM) cells. The memory cells may be resistive type memory cells. Other types of memory cells may also be useful. The memory cells may be similar to those described in FIG. 1. Common elements may not be described or described in detail.

Referring to FIGS. 2a-2b, a substrate 205 is shown. The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

The substrate includes an array region for memory cells. Other regions (not shown) may also be provided. For example, the device may include logic regions. The logic region may include various types of regions, such as high voltage, low voltage and intermediate voltage regions. High voltage devices, such as transistors are formed in the high voltage region, low voltage devices are formed in the low voltage region and intermediate voltage devices are formed in the intermediate voltage region. The transistors are formed on the substrate.

Interlevel dielectric (ILD) layers may be provided over the substrate for forming interconnections of various transistors and components of the device. For example, an ILD layer includes a metal level and a contact level below the metal level. The metal level is a dielectric layer, such as silicon oxide which includes conductors or metal lines while the contact level is a dielectric layer which includes contacts. Other types of dielectric materials may also be useful. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different.

The metal level of an ILD layer is referred to as Mx, where x is the number of metal levels. The first metal level may be referred to as M1 while the top metal level is referred to as Mx. A via level of an ILD level may be designated as Vx−1. As for the contact level which is disposed below M1 and over the substrate, it may be referred to as premetal dielectric (PMD) or CA level. Generally, the contacts in the PMD layer are tungsten contacts. Dielectric liner (not shown) may be disposed between ILD levels. The dielectric liner, for example, serves as an etch stop layer. The dielectric liner may be formed of a low k dielectric. For example, the dielectric liner may be nBLOK. Other configurations of ILD layers may also be useful. It is understood that different ILD layers may have different types of materials.

In one embodiment, the substrate includes a cell dielectric layer 270. The cell dielectric layer includes first and second cell dielectric layers 272 and 274. As shown, the first cell dielectric layer 272 is a lower cell dielectric layer and the second cell dielectric layer 274 is an upper cell dielectric layer. For example, the first cell dielectric layer is disposed below the second cell dielectric layer. Providing the first cell dielectric layer disposed over the second cell dielectric layer may also be useful.

The cell dielectric layer may be part of an ILD layer. For example, the cell dielectric layer may be part of a contact level of an ILD layer below the metal level. In one embodiment, the cell dielectric layer is part of the PMD level. For example, the cell dielectric layer is disposed over the substrate over the transistors but below M1. Providing the cell dielectric layer in other ILD layers may also be useful. The cell dielectric layer, for example, may be silicon oxide. The cell dielectric layer may be of the same material as the contact levels. Providing cell dielectric layers having other types of or different dielectric materials than the contact levels may also be useful. Furthermore, it is understood that the first and second cell dielectric layers need not be of the same type of dielectric material.

Memory cells 110 are disposed in the cell dielectric layer. For example, memory cells are disposed in the cell dielectric layer in the array region of the device. As shown, the memory cells are interconnected to form two columns and three rows of memory cells. It is understood that an array may have many more columns and rows of memory cells.

A memory cell includes a cell selector 120, a storage unit and first and second cell terminals 114 and 116. The cell selector, in one embodiment is a transistor, such as a metal oxide semiconductor (MOS) transistor. In one embodiment, the transistor is a polysilicon transistor. For example, a body of the transistor is polysilicon. Other types of transistors may also be useful.

In one embodiment, disposed between the upper and lower cell dielectric layers are transistor body and gate dielectric layers 221 and 225. The transistor body layer serves as the body of the transistor. The transistor body layer, in one embodiment, is a polysilicon layer. Other types of semiconductor layers may also be useful for the transistor body layer. For example, the transistor body layer may be low-temperature SiGe or recrystallized amorphous Si. The body layer is doped with second polarity type dopants. For example, the body layer is lightly or intermediately doped with second polarity type dopants. Typically, the body layer is doped with second polarity type dopants having a concentration of about 1E12-1E13. Other dopant concentrations may also be useful. As for the gate dielectric layer, it may be silicon oxide. Other types of gate dielectric materials may also be useful. For example, SiON, $Si_3N_4$ or high-k dielectrics may also be useful.

The gate dielectric layer is adjacent to the first cell dielectric layer and the body layer is adjacent to the second cell dielectric layer. For example, the gate dielectric layer is disposed on the lower cell dielectric layer, the body layer is disposed on the gate dielectric layer and the upper or second cell dielectric layer is disposed on the body layer. Other configurations of gate dielectric and body layers may also be useful. For example, the configuration may be flipped, having the storage unit below the transistor.

A cell select transistor includes a gate 112 and first and second S/D regions 124 and 126 in the transistor body. The S/D regions are disposed on first and second sides of the gate. The S/D regions, for example, are heavily doped with first polarity type dopants. The dopant concentration of the S/D regions may be about 1E14-1E15. Other dopant concentrations may also be useful. In some embodiments, the S/D regions may be the same as the transistor body layer. For example, the S/D regions may be doped with the same dopant type and concentration as the channel or transistor body layer. Between the S/D regions in the transistor body layer is a channel 228 of the transistor. The S/D regions, for example, serve as cell terminals. Metal silicide contacts may be provided on the S/D regions.

The gate 112 is disposed in the first cell dielectric layer. As shown, the gate is disposed in the lower cell dielectric layer. For example, the gate is disposed in a gate trench in the lower cell dielectric layer. Illustratively, the top surface of the gate is coplanar with the top surface of the lower cell dielectric layer. Other configurations of the gate and lower cell dielectric layer may also be useful. For example, the top surface of the gate may be above or below the top of the lower cell dielectric layer. The gate, for example, is a polysilicon gate. A plurality of gates of a plurality of memory cells are provided in the lower cell dielectric layer.

In one embodiment, the gate is an elongated gate member or conductor. The gate conductor is disposed in gate trenches along the first direction. For example, the gate conductor is disposed in a gate trench 227 along the wordline direction. The first and second directions may be orthogonal to each other. Providing non-orthogonal first and second directions may also be useful. A gate conductor may serve as a common gate for other memory cells along the row or wordline direction. For example, a gate conductor couples memory cells, forming a row of memory cells in the wordline direction. As shown, the memory cells are configured into three rows.

In one embodiment, the transistor body and gate dielectric layers serve as common layers for transistors of a column. For example, body and gate dielectric layers are configured as distinct elongated body unit members or conductors 230. The body unit conductors are disposed along the second or bitline BL direction. Providing other configurations of the body and gate dielectric layers may also be useful. For example, the gate dielectric layer may be a common gate dielectric layer for columns of memory cells. As shown, the memory cells are configured into two columns.

The gate dielectric layer is disposed adjacent to the gates. For example, the gate dielectric layer is disposed on the lower cell dielectric layer. The transistor body layer is disposed adjacent to the gate dielectric layer. For example, the transistor body layer is disposed on the gate dielectric layer.

As discussed, first and second doped S/D regions of the transistors are disposed in the transistor body layer. For example, first S/D region 124 is disposed adjacent to a first side of a gate and second S/D region 126 is disposed adjacent to a second side of a gate. In one embodiment, adjacent cell select transistors share a common S/D region. For example, a second S/D region of one transistor serves as a first S/D region of an adjacent transistor. The S/D regions serve as terminals of a memory cell. For example, a first S/D region serves as a first terminal of a memory cell while a second S/D region serves as a second terminal of a memory cell. Adjacent memory cells share a common terminal.

In one embodiment, the storage unit is disposed on the body layer. The second cell dielectric layer is disposed over the storage unit. For example, the upper cell dielectric is disposed over the storage unit. The storage unit includes a storage element 140 with first and second storage terminals 144 and 146. The cell selector and storage element are coupled in parallel. For example, the first S/D region is coupled to the first storage terminal while the second S/D region is coupled to the second storage terminal. Coupling the storage element and cell selector in parallel forms a NAND type memory cell.

In one embodiment, the storage unit is an elongated storage member or conductor disposed along the first or wordline direction. For example, the storage conductor serves as storage units for a row of memory cells. Distinct storage conductors are provided for different rows of memory cells.

In one embodiment, the storage element is a resistive element R. Other types of storage elements may also be useful. In one embodiment, the resistive element is a thermal-based resistive element. For example, the thermal-based resistive element is a PC resistive element. A thermal-based resistive element includes a heater or heating element for changing the resistive element from one resistive state to another. The PC resistive element, for example, may include a chalcogenide material. In one embodiment, the chalcogenide material is a GeSbTe alloy. In one embodiment, the chalcogenide material is $Ge_2Sb_2Te_5$ (GST). Other types of chalcogenide or PCMs may also be employed. Other types of thermal-based resistive elements forming other types of RAMs may also be useful.

In other embodiments, the resistive element is a non-thermal based resistive elements. For example, the programmable resistive element includes a resistive material, forming a ReRAM. The resistive material, for example, is a transitional metal oxide, such as $TiO_x$, NiOx, AlOx, HfOx, WOx, TaOx, VOx, and copper oxide CuOx. Other types of programmable resistive materials may also be useful. Other configurations of the non-thermal based resistive element may also be useful. Providing other types of storage or resistive elements may also be useful.

First and second storage electrodes, in one embodiment, are disposed on sides of the storage elements, forming storage unit conductors. The electrodes, for example, line sidewalls of the storage element conductors. The electrodes serve as storage terminals. The electrodes may be formed of an ECM. The type of ECM material may, for example, depend on the type of resistive element of the storage units. The electrode may be a composite electrode. For example, in the case of a PCM storage unit, the electrodes may be a composite electrode, including a heater. The heater may be a low conductive ECM, such as TiN while the electrode may be TaN. In the case of a Re-RAM, the electrode may be an electrode stack, such as $TiON/SiO_2$, or a transition-metal oxide (TMO), such as HfO and ZrO. Other types of ECMs or configurations of electrodes may also be useful. In some embodiments, the transistor body may serve as a heating element. For example, the PC element and the transistor body, which serves as the heating element, are provided. In such cases, electrodes may not be needed.

As shown, along the wordline direction, a width of the storage unit conductors is wider than a width of the gate conductors. For example, sidewalls of the storage units extend outside sidewalls of the gates. This improves process window, such as misalignment, to ensure that the terminals of the storage unit are coupled to the terminals or S/D regions of the transistor.

As discussed, storage units within a column of memory cells are distinct. The storage units of memory cells within a column are isolated from each other by the second cell dielectric layer. For example, the upper cell dielectric layer covers and isolates the storage units within a column of memory cells. The second cell dielectric layer may include voids 278. As shown, a void is disposed between adjacent storage conductors. The voids, for example, may extend a length of the dielectric layer along the wordline direction. Providing voids improve isolation between storage units within a row of memory cells. The voids, for example, may result from imperfect gap fill between the gates. Providing a cell dielectric layer with no voids may also be useful.

A column of memory cells are coupled in series. For example, a second terminal of one memory cell is coupled to a first terminal of another memory cell. In one embodiment, the column of memory cells is coupled between first and second column selectors $150_1$-$150_2$. The column selectors, for example, are transistors, such as MOS transistors. In one embodiment, a column selector has the same structure as a memory cell. Other types of column selectors or transistors may also be useful. For example, a column selector includes a gate disposed in the first cell dielectric layer and a storage unit disposed in the second cell dielectric layer, with the common body conductor disposed between them. First and second S/D regions are disposed in the body layer on first and second sides of the gate. The S/D regions are, for example, heavily doped regions with first polarity type dopants. Metal silicide contacts may be disposed on the S/D regions. Other configurations of S/D regions may also be useful. The storage unit, for example, is optional in the case of first and second column selectors. As shown, the second S/D of the first column selector is common with the first S/D of the first memory cell of a column while the first S/D of the second column selector is common with the second S/D of a last memory cell of the column.

In one embodiment, at least the S/D of the column selectors which are not common to S/D of memory cells are heavily doped S/D regions. In some embodiments, the S/D regions of the column selectors which are common to S/D regions of memory cells may be the same as the transistor body. For example, the S/D regions may be doped with the same dopant type and concentration as the channel or transistor body. Other configurations of S/D regions of the column selectors may also be useful.

The first S/D of the first column selector is coupled to a bitline BL and its gate is coupled to a SSL; the second S/D of the second column selector is coupled to a source line SL and its gate is coupled to a GSL. In some embodiments, the BL and SL are coupled to drain and source regions of the first and second column selectors respectively. For example, the BL and SL are coupled to heavily doped drain and source regions of a first polarity. As for gates of the cell selectors, they are coupled to WLs.

The various lines coupled to various terminals of rows of memory cells are disposed on metal levels. The metal levels, for example, are disposed above the cell dielectric layer. Contacts may be provided to couple the metal lines to the various terminals of the memory cells. Different lines may be provided in different metal levels. For example, WLs and BLs are provided on different levels. In the case where the cell dielectric layer is disposed as part of the PMD level, the lines may be provided on M1 or above. The SLs, GSLs and SSLs, for example, are in the BL direction. For example, SLs, GSLs and SSLs may be disposed in the same level as the BLs. Other configurations of lines and metal levels may also be useful.

As discussed, metal silicide contacts (not shown) may be formed on the contact or terminal regions of the transistors. For example, silicide contacts are disposed on the gate electrodes and S/D regions of the cell selectors and column selectors. The metal silicide contacts may be nickel-based silicide contacts. Other types of silicide contacts may also be useful. The silicide contacts may be employed to reduce contact resistance and facilitate contact to the back-end-of-line (BEOL) metal interconnects.

As described, the storage unit is disposed above the gate. In other embodiments, the storage unit may be disposed below the gate. Other configurations may also be useful.

Figure 3A:
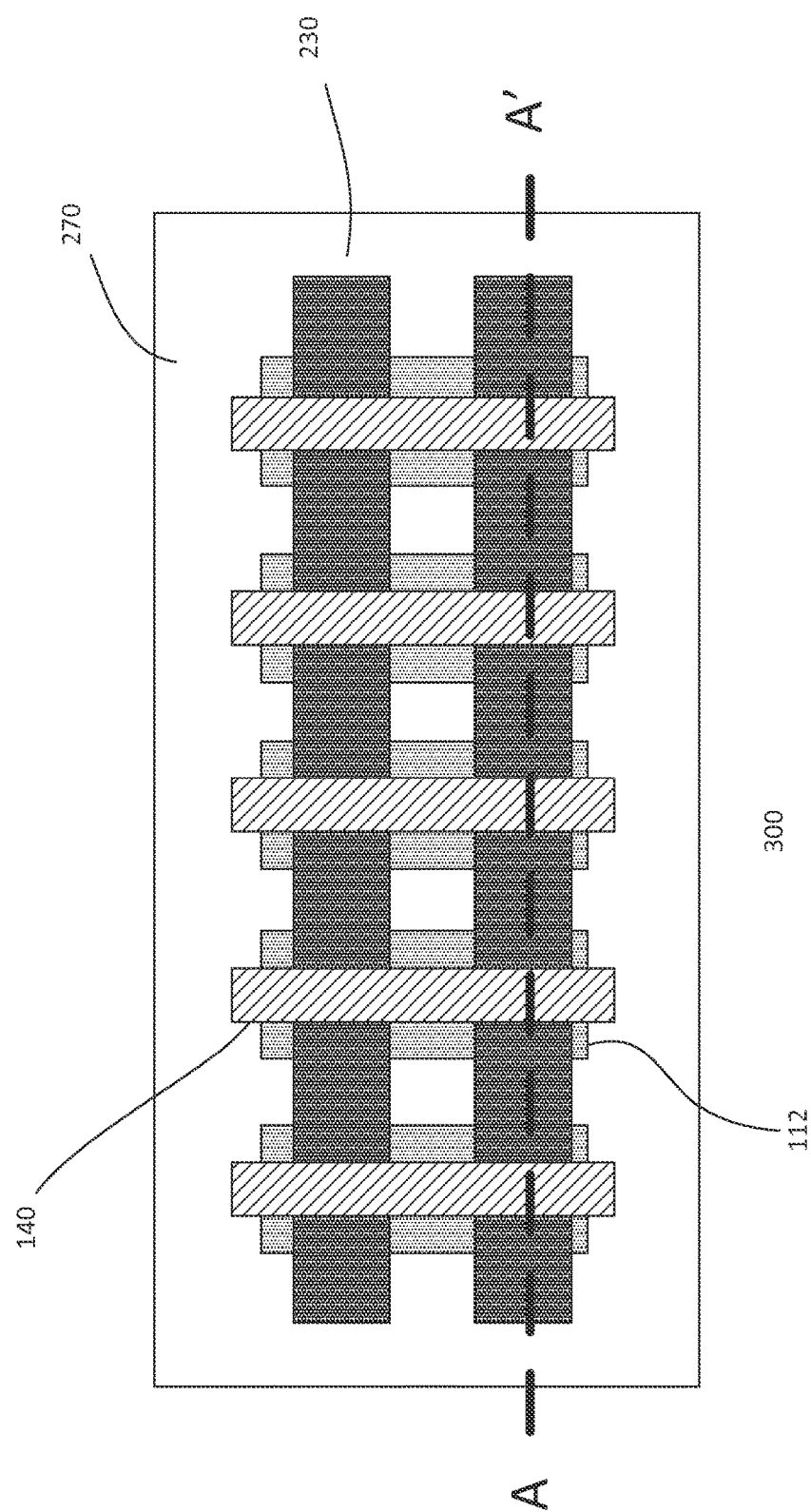
FIGS. 3a-3b show simplified plan and cross-sectional views of an embodiment of a device.
Figure 3B:
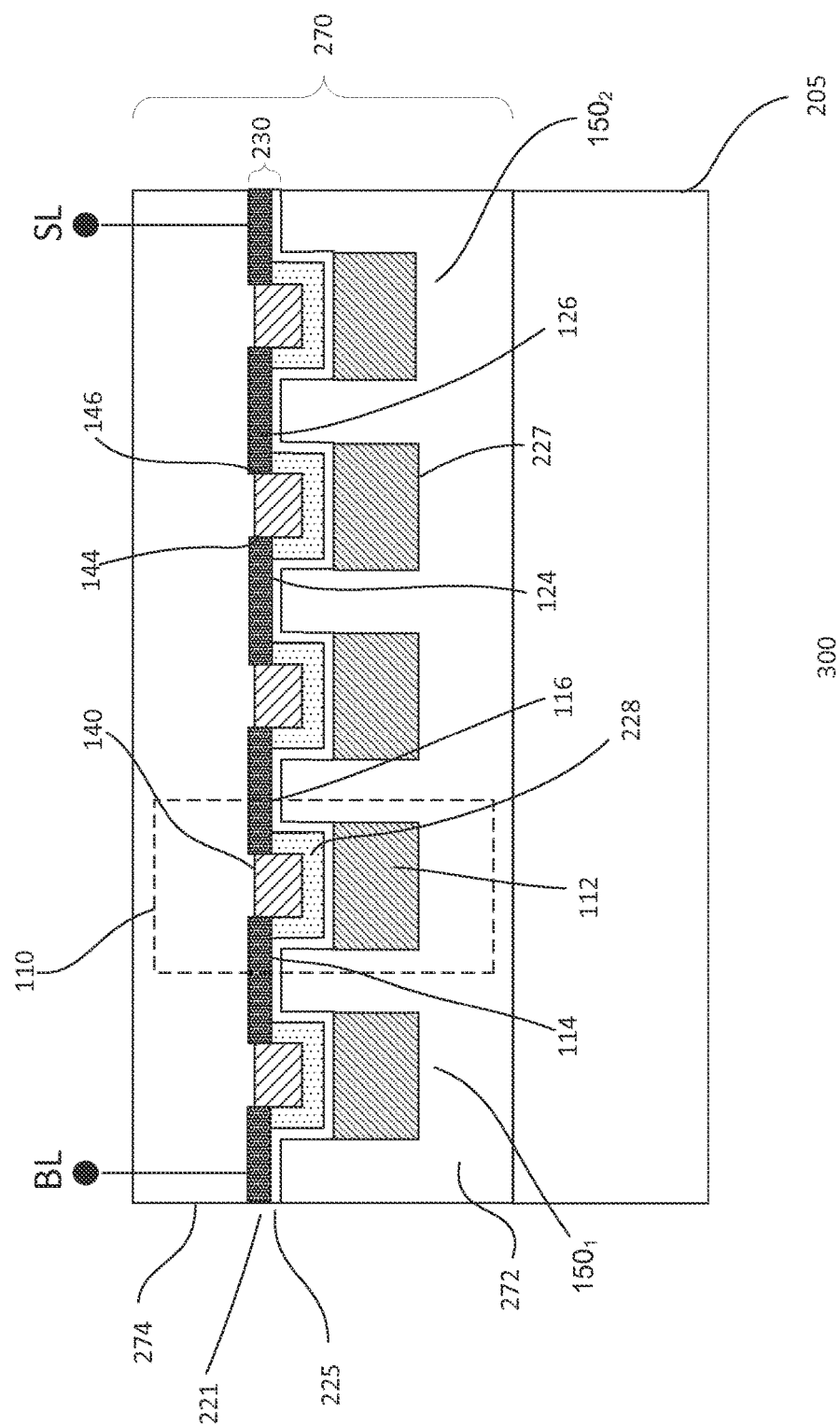

FIGS. 3a-3b show simplified plan and cross-sectional views of an embodiment of a device 300. The cross-sectional view is along A-A' which is along a second direction of the device. The second direction, for example, is along a bitline BL direction. The device includes a plurality of n memory cells 110. The memory cells, in one embodiment, are non-volatile memory (NVM) cells. The memory cells may be resistive type memory cells. Other types of memory cells may also be useful. The memory cells may be similar to those described in FIG. 1 and FIGS. 2a-2b. Common elements may not be described or described in detail.

Referring to FIGS. 3a-3b, a substrate 205 is shown. The substrate, for example, is a semiconductor substrate, such as a silicon substrate. Other types of substrates may also be useful. The substrate includes an array region for memory cells. Other regions (not shown) may also be provided. Transistors may be formed on the substrate. Interlevel dielectric (ILD) layers may be provided over the substrate for forming interconnections of various transistors and components of the device.

In one embodiment, the substrate includes a cell dielectric layer 270. The cell dielectric layer includes first and second cell dielectric layers 272 and 274. As shown, the first cell dielectric layer is a lower cell dielectric layer and the second cell dielectric layer is an upper cell dielectric layer. For example, the first cell dielectric layer is disposed below the second cell dielectric layer. Providing the first cell dielectric disposed over the second cell dielectric layer may also be useful.

Memory cells 110 are disposed within the cell dielectric layer. For example, memory cells are disposed in the cell dielectric layer in the array region of the device. As shown, the memory cells are interconnected to form two columns and three rows of memory cells. It is understood that an array may have many more columns and rows of memory cells.

A memory cell includes a cell selector 120 and a storage unit. The cell selector, in one embodiment, is a transistor, such as a metal oxide semiconductor (MOS) transistor. In one embodiment, the transistor is a polysilicon transistor. For example, a body of the transistor is polysilicon. Other types of transistors may also be useful.

Transistor body and gate dielectric layers 221 and 225 are disposed between lower and upper dielectric layers 272 and 274. The transistor body layer serves as the body of the transistor. The transistor body layer, in one embodiment, is a polysilicon layer. Other types of semiconductor layers may also be useful for the transistor body layer. The gate dielectric layer may be silicon oxide. Other types of gate dielectric materials may also be useful. For example, SiON, $Si_3N_4$ or high-k dielectrics may be useful to serve as a gate dielectric.

The gate dielectric layer is adjacent to the first cell dielectric layer and the body layer is adjacent to the second cell dielectric layer. For example, the gate dielectric layer is disposed on the lower cell dielectric layer while the body layer is disposed on the gate dielectric layer and the upper cell dielectric layer is disposed on the body layer. Other configurations of gate dielectric and body layers may also be useful. For example, the gate dielectric layer may be disposed below the body layer in the case the storage unit is disposed below the gate.

In one embodiment, the lower cell dielectric layer includes gate trenches 227. The trenches are disposed along a first or wordline direction. Disposed in the trenches are gates 112 of transistors. The gates, for example, are gate conductors along the first or wordline direction. In one embodiment, the gates partially fill the trenches. For example, the gates partially fill the gate trenches, leaving trench recesses over the gate.

The gate dielectric and body layers, in one embodiment, are disposed on the surface of the lower cell dielectric layer and line the trench recesses above the gates. In one embodiment, the transistor body and gate dielectric layers serve as common layers for transistors of a column. For example, body and gate dielectric layers are configured as distinct elongated body unit members or conductors 230. The body unit conductors are disposed along the second or bitline BL direction. Providing other configurations of the body and gate dielectric layers may also be useful. For example, the gate dielectric may be a common gate dielectric layer for other columns of memory cells.

The body unit layers are conformal layers, forming body unit features following the underlying topography. In one embodiment, the body unit features are body unit recesses. For example, the body unit layers form body recesses disposed over the gate trenches. In one embodiment, the body recesses have sidewalls which are disposed within the sidewalls of the gates or trenches.

Storage units are disposed on the body features. In one embodiment, the storage units are disposed in the body recesses. As shown, the storage units have top surfaces slightly below the top surface of body layer outside of the trenches. Providing top surfaces of the storage unit at other levels with respect to the top surface of the body layer outside of the trenches may also be useful. For example, the top surface of the storage units may be at the same level as the top surface of the body layer. Providing the top surface of the storage units which may be higher than the top surface of the body layer may also be useful. For example, the top surface of the storage units may be slightly higher than the top surface of the body layer. A storage unit includes a storage element 140 with first and second storage terminals 144 and 146. The upper cell dielectric layer is disposed over the body layer and storage unit.

First and second storage electrodes, in one embodiment, are disposed on sides of the storage elements, forming storage unit conductors. The electrodes, for example, lines sidewalls of the body recesses. The electrodes serve as first and second storage terminals of the storage units. The electrodes may be formed of an ECM. The type of ECM material may, for example, depend on the type of resistive element of the storage units. The electrode may be a composite electrode. For example, in the case of a PCM storage unit, the electrodes may be a composite electrode, including a heater. The heater may be an ECM, such as TiN while the electrode may be TaN. In some embodiments, the transistor body may serve as a heater. For example, the PC element and the transistor body, which serves as the heater, are provided. In such embodiments, electrodes may not be needed. In the case of a Re-RAM, the electrode may be an electrode stack, such as $TiON/SiO_2$, or a transition-metal oxide (TMO), such as HfO and ZrO. Other types of ECMs or configurations of electrodes may also be useful.

First and second S/D regions 114 and 116 are provided in the transistor body for the select transistors. The S/D regions are, for example, heavily doped regions with first polarity type dopants. Other configurations of S/D regions may also be useful. Metal silicide contacts may be provided on the S/D regions. Adjacent select transistors share a common S/D region. For example, a second S/D region and a first S/D region of adjacent transistors form a common S/D region. In some embodiment, the S/D regions may be the same as the transistor body. For example, the S/D regions may be doped with the same dopant type and concentration as the channel or transistor body. Other configurations of S/D regions of the column selectors may also be useful. The cell selector and storage element of the memory cell are coupled in parallel. For example, the first S/D region is coupled to the first storage terminal while the second S/D terminal is coupled to the second storage terminal. Coupling the storage element and cell selector in parallel forms a NAND type memory cell.

In one embodiment, the storage units are elongated storage members or conductors disposed along the first or wordline direction. For example, a storage conductor serves as storage units for a row of memory cells. Distinct storage conductors are provided for different rows of memory cells.

As shown, a width of the storage element is smaller than a width of the gates. In particular, the storage element is disposed within sidewalls of the gate. This ensures that the storage element is aligned with the select transistor. In one embodiment, the body trenches self-align the storage units.

A column of memory cells are coupled in series. For example, a second terminal of one memory cell is coupled to a first terminal of another memory cell. In one embodiment, the column of memory cells is coupled between first and second column selectors $150_1$-$150_2$. The column selectors, for example, are transistors, such as MOS transistors. In one embodiment, a column selector has the same structure as a memory cell. Other types of column selectors or transistors may also be useful. First and second S/D regions are disposed in the body layer on first and second sides of the gate. The S/D regions are, for example, heavily doped regions with first polarity type dopants. Metal silicide contacts may be provided on the S/D regions. Other configurations of S/D regions may also be useful.

In one embodiment, at least the S/D terminals of the column selectors coupled to the BL and SL are heavily doped S/D regions. In some embodiments, the S/D terminals of the column selectors not coupled to BL and SL may be the same as the transistor body. For example, the S/D regions may be doped with the same dopant type and concentration as the channel or transistor body. Other configurations of S/D regions of the column selectors may also be useful. Metal silicide contacts may be provided on the S/D regions.

The first S/D of the first column selector is coupled to a bitline BL and its gate is coupled to a SSL; the second S/D of the second column selector is coupled to a source line SL and its gate is coupled to a GSL. In some embodiments, the BL and SL are coupled to drain and source regions of the first and second column selectors respectively. For example, the BL and SL are coupled to heavily doped drain and source regions of a first polarity. As for gates of the cell selectors, they are coupled to WLs.

In one embodiment, at least the S/D terminals of the column selectors coupled to the BL and SL are heavily doped S/D regions. In some embodiments, the S/D terminals of the column selectors not coupled to BL and SL may be the same as the transistor body. For example, the S/D regions of the column selectors not coupled to BL and SL may be doped with the same dopant type and concentration as the channel or transistor body. Other configurations of S/D regions of the column selectors may also be useful.

The various lines coupled to various terminals of row of memory cells are disposed on metal levels. The metal levels, for example, are disposed above the cell dielectric layer. Contacts may be provided to couple the metal lines to the various terminals of the memory cells. Different lines may be provided in different metal levels. For example, WLs and BLs are provided on different levels. In the case where the cell dielectric layer is disposed as part of the PMD level, the lines may be provided on M1 or above. Other configurations of lines and metal levels may also be useful.

As discussed, metal silicide contacts may be formed on the contact or terminal regions of the transistors. For example, silicide contacts are disposed on the gate electrodes and S/D regions of the cell selectors and column selectors. The metal silicide contacts may be nickel-based silicide contacts. Other types of silicide contacts may also be useful. The silicide contacts may be employed to reduce contact resistance and facilitate contact to the back-end-of-line (BEOL) metal interconnects.

Figure 4A:
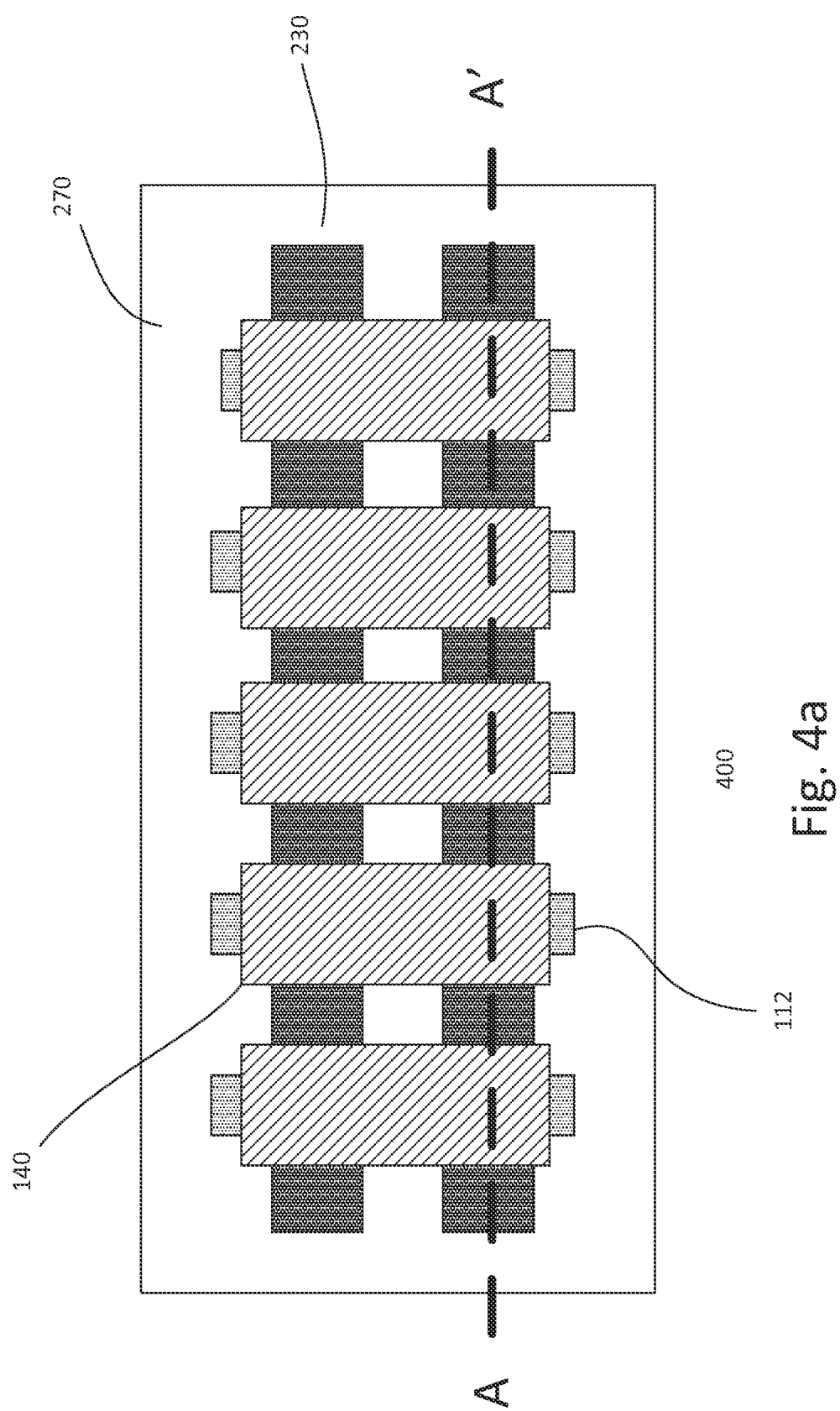
FIGS. 4a-4b show simplified plan and cross-sectional views of an embodiment of a device.
Figure 4B:
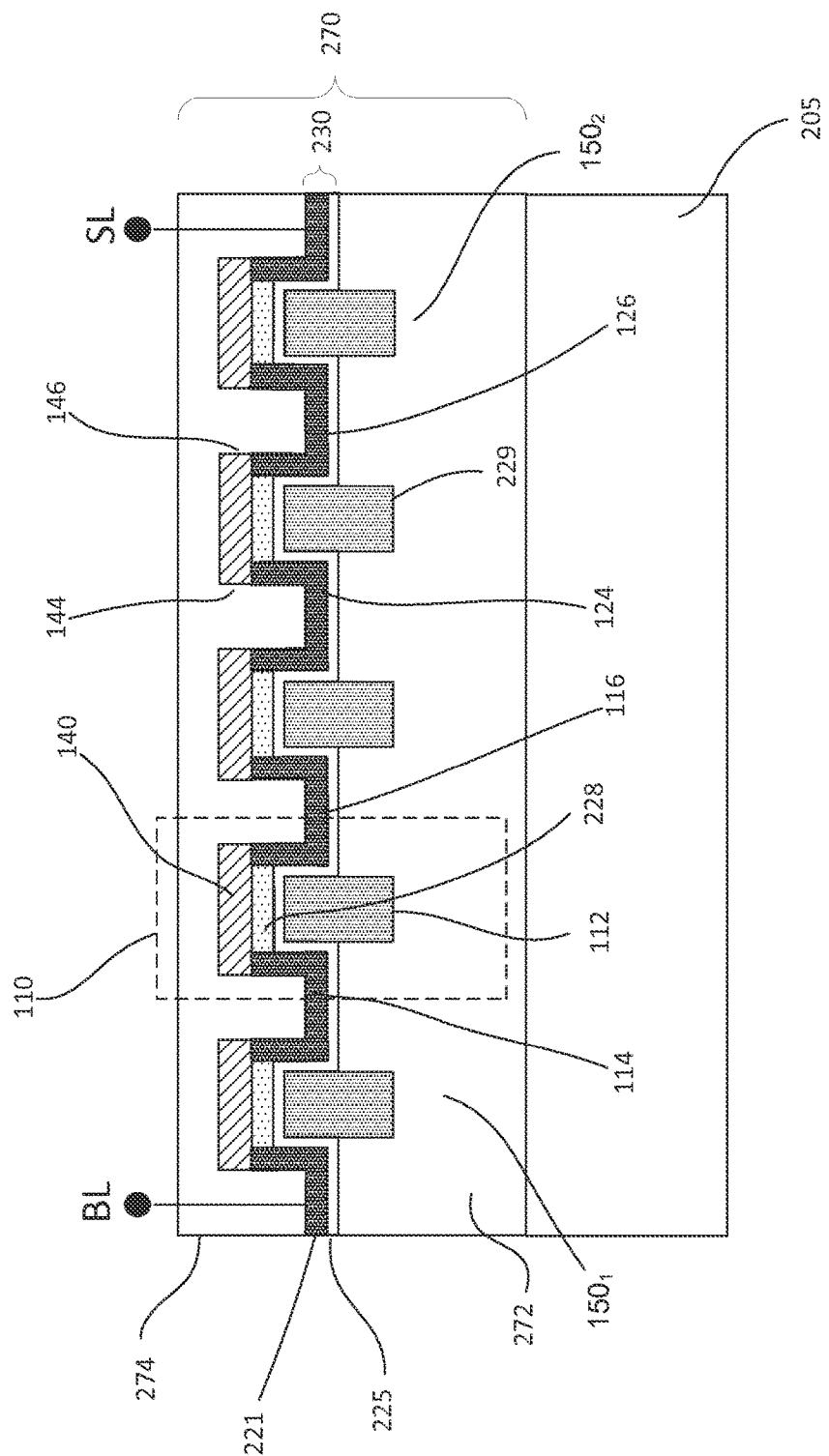

FIGS. 4a-4b show simplified plan and cross-sectional views of an embodiment of a device 400. The cross-sectional view is along A-A' which is along a second direction of the device. The second direction, for example, is along a bitline BL direction. The device includes a plurality of n memory cells 110. The memory cells, in one embodiment, are non-volatile memory (NVM) cells. The memory cells may be resistive type memory cells. Other types of memory cells may also be useful. The memory cells may be similar to those described in FIG. 1, FIGS. 2a-2b and FIGS. 3a-3b. Common elements may not be described or described in detail.

Referring to FIGS. 4a-4b, a substrate 205 is shown. The substrate, for example, is a semiconductor substrate, such as a silicon substrate. Other types of substrates may also be useful. The substrate includes an array region for memory cells. Other regions (not shown) may also be provided. Transistors may be formed on the substrate. Interlevel dielectric (ILD) layers may be provided over the substrate for forming interconnections of various transistors and components of the device.

In one embodiment, the substrate includes a cell dielectric layer 270. The cell dielectric layer includes first and second cell dielectric layers 272 and 274. As shown, the first cell dielectric layer is a lower cell dielectric layer and the second cell dielectric layer is an upper cell dielectric layer. For example, the first cell dielectric layer is disposed below the second cell dielectric layer. Providing the first cell dielectric disposed over the second cell dielectric layer may also be useful.

Memory cells 110 are disposed in the cell dielectric layer. For example, memory cells are disposed within the cell dielectric layer in the array region of the device. As shown, the memory cells are interconnected to form two columns and three rows of memory cells. It is understood that an array may have many more columns and rows of memory cells.

A memory cell includes a cell selector 120 and a storage unit. The cell selector, in one embodiment is a transistor, such as a metal oxide semiconductor (MOS) transistor. In one embodiment, the transistor is a polysilicon transistor. For example, a body of the transistor is polysilicon. Other types of transistors may also be useful.

Transistor body and gate dielectric layers 221 and 225 are disposed between lower and upper dielectric layers 272 and 274. The transistor body layer serves as the body of the transistor. The transistor body layer, in one embodiment, is a polysilicon layer. Other types of semiconductor layers may also be useful for the transistor body layer. The gate dielectric layer may be silicon oxide. Other types of gate dielectric materials may also be useful. For example, SiON, $Si_3N_4$ or high-k may be useful to serve as a gate dielectric.

The gate dielectric layer is adjacent to the first cell dielectric layer and the body layer is adjacent to the second cell dielectric layer. For example, the gate dielectric layer is disposed on the lower cell dielectric layer while the body layer is disposed on the gate dielectric layer and the upper cell dielectric layer is disposed on the body layer. Other configurations of gate dielectric and body layers may also be useful. For example, the gate dielectric layer may be disposed below the body layer in the case the storage unit is disposed below the gate.

In one embodiment, the lower cell dielectric layer includes trenches 229. In one embodiment, the trenches are gate trenches. In other embodiments, the trenches may be storage trenches. The trenches are disposed along a first or wordline direction. Disposed in the trenches are gates 112 of transistors. The gates, for example, are gate conductors along the first or wordline direction. In one embodiment, the gates fill the trenches and protrude above the top surface of the lower cell dielectric layer. For example, the gates extend above the surface of the lower cell dielectric layer, forming gate mesas. In one embodiment, about 30-50% of the gate is disposed over the surface of the lower cell dielectric layer. Providing gates which protrude above the lower cell dielectric layer may also be useful. The amount, for example, may depend the desired aspect ratio.

The gate dielectric and body layers, in one embodiment, are disposed on the surface of the lower cell dielectric layer and line the gates. In one embodiment, the transistor body and gate dielectric layers serve as common layers for transistors of a column. For example, body and gate dielectric layers are configured as distinct elongated body unit members or conductors 230. The body unit conductors are disposed along the second or bitline BL direction. Providing other configurations of the body and gate dielectric layers may also be useful. For example, the gate dielectric layer may be a common gate dielectric layer for columns of memory cells.

The body units form body unit features, following the underlying topography. In one embodiment, the body unit features are body unit mesas. For example, the body layer forms body mesas disposed over the gate mesas. In one embodiment, the body mesas have sidewalls which are disposed beyond the sidewalls of the gates or trenches.

Storage units are disposed on the body features. In one embodiment, the storage units are disposed on the body mesas. In one embodiment, the storage units are elongated storage members or conductors disposed along the first or wordline direction. For example, a storage unit conductor serves as storage units for a row of memory cells. Distinct storage unit conductors are provided for different rows of memory cells. In some embodiments, the gate dielectric layer may be a common gate dielectric layer different columns of memory cell. For example, the gate dielectric layer may be a blanket gate dielectric layer.

As shown, the storage units have sidewalls equal to edges or sidewalls of the body mesas. For example, the storage unit sidewalls are aligned with sidewalls of the body mesas. In one embodiment, the storage unit sidewalls are self-aligned with the sidewalls of the body mesas. Providing storage unit sidewalls which are not self-aligned to the sidewalls of the body mesas may also be useful. Providing storage units having sidewalls not aligned with sidewalls of the body mesas may also be useful. A storage unit includes a storage element 140 with first and second storage terminals 144 and 146. The upper cell dielectric layer is disposed over the body layer and storage unit.

First and second storage electrodes, in one embodiment, are disposed on sides of the storage elements or storage element conductors, forming storage unit conductors. The electrodes, for example, line sidewalls of the storage elements. The electrodes serve as first and second storage terminals of the storage units. The electrodes may be formed of an ECM. The type of ECM material may, for example, depend on the type of resistive element of the storage units. The electrode may be a composite electrode. For example, in the case of a PCM storage unit, the electrodes may be a composite electrode, including a heater. The heater may be a high conductive ECM, such as TiN while the electrode may be TaN. In some embodiments, the transistor body may serve as a heater. For such embodiments, no electrodes need to be provided. In the case of a Re-RAM, the electrode may be an electrode stack, such as TiON/SiO$_2$, or a transition-metal oxide (TMO), such as HfO and ZrO. Other types of ECMs or configurations of electrodes may also be useful.

First and second S/D regions 114 and 116 are provided in the transistor body for the select transistors. The S/D regions are, for example, heavily doped regions with first polarity type dopants. Metal silicide contacts may be provided on the S/D regions. Other configurations of S/D regions may also be useful. In some embodiments, the S/D regions may be the same as the transistor body. For example, the S/D regions may be doped with the same dopant type and concentration as the transistor body. Adjacent select transistors share a common S/D region. For example, a second S/D region and a first S/D region of adjacent transistors form a common S/D region.

The cell selector and storage element of the memory cell are coupled in parallel. For example, the first S/D region is coupled to the first storage terminal while the second S/D terminal is coupled to the second storage terminal. Coupling the storage element and cell selector in parallel forms a NAND type memory cell.

A column of memory cells are coupled in series. For example, a second terminal of one memory cell is coupled to a first terminal of another memory cell. In one embodiment, the column of memory cells is coupled between first and second column selectors $150_1$-$150_2$. The column selectors, for example, are transistors, such as MOS transistors. In one embodiment, a column selector has the same structure as a memory cell. Other types of column selectors or transistors may also be useful. For example, a column selector includes a gate disposed in the first cell dielectric layer and a storage unit disposed in the second cell dielectric layer, with the common body conductor disposed between them. First and second S/D regions are disposed in the body layer on first and second sides of the gate. The S/D regions are, for example, heavily doped regions with first polarity type dopants. Metal silicide contacts may be provided on the S/D regions. Other S/D configurations may also be useful. As shown, the second S/D of the first column selector is common with the first S/D of the first memory cell of a column while the first S/D of the second column selector is common with the second S/D of a last memory cell of the column.

The first S/D of the first column selector is coupled to a bitline BL and its gate is coupled to a SSL; the second S/D of the second column selector is coupled to a source line SL and its gate is coupled to a GSL. As for gates of the cell selectors, they are coupled to WLs. In one embodiment, at least the S/D terminals of the column selectors coupled to the BL and SL are heavily doped S/D regions. Metal silicide contacts may be provided on the S/D regions. In some embodiments, the S/D terminals of the column selectors not coupled to BL and SL may be the same as the transistor body. For example, the S/D regions may be doped with the same dopant type and concentration as the channel or transistor body. Other configurations of S/D regions of the column selectors may also be useful.

The various lines coupled to various terminals of row of memory cells are disposed on metal levels. The metal levels, for example, are disposed above the cell dielectric layer. Contacts may be provided to couple the metal lines to the various terminals of the memory cells. Different lines may be provided in different metal levels. For example, WLs and BLs are provided on different levels. In the case where the cell dielectric layer is disposed as part of the PMD level, the lines may be provided on M1 or above. Other configurations of lines and metal levels may also be useful.

As discussed, metal silicide contacts may be formed on the contact or terminal regions of the transistors. For example, silicide contacts are disposed on the gate electrodes and S/D regions of the cell selectors and column selectors. The silicide contacts may be employed to reduce contact resistance and facilitate contact to the back-end-of-line (BEOL) metal interconnects.

FIGS. 5a-5d show cross-sectional views of an embodiment of a process for forming a device or IC 500. The device, for example, includes memory cells 110. The memory cells, in one embodiment, are NVM cells. The memory cells may be resistive type memory cells. Other types of memory cells may also be useful. The memory cells may be similar to those described in FIG. 1 and FIGS. 2a-2b. Common elements may not be described or described in detail. The cross-sectional view is along A-A' which is along a second or wordline direction.

Referring to FIG. 5a, a substrate 205 is provided. The substrate, for example, is a semiconductor substrate, such as a silicon substrate. Other types of substrates may also be useful. The substrate includes an array region for memory cells. Other regions (not shown) may also be provided. Transistors may be formed on the substrate corresponding to the different regions. Interlevel dielectric layers may be provided over the substrate for forming interconnections of various transistors and components of the device.

In one embodiment, the substrate includes a dielectric layer 272. The dielectric layer, for example, serves as a lower cell dielectric layer of a cell dielectric layer 270. The cell dielectric layer, for example, is silicon oxide. Other types of cell dielectric materials, such as those used in ILD layer of the device may also be useful. The dielectric layer, for example, may be deposited by chemical vapor deposition (CVD). Other techniques for forming the dielectric layer may also be useful. A planarizing process may be performed. The planarizing process, for example, may include chemical mechanical polishing (CMP). Other types of planarizing process may also be useful. The planarizing process produces a planar surface for the dielectric layer.

The lower cell dielectric layer is patterned to form trenches 227. In one embodiment, the trenches are elongated gate trenches disposed along a first or wordline direction. Other types of trenches, such as resistive element trenches, may also be useful. Patterning the gate trenches may be achieved by mask an etch techniques. For example, a photoresist or soft mask may be provided on the dielectric layer and exposed with an exposure source using a reticle with the desired pattern. The exposed photoresist is developed, transferring the pattern of the reticle to the photoresist. For example, the patterned photoresist includes openings corresponding to the trenches. An anisotropic etch, such as reactive ion etch (RIE), is performed using the patterned photoresist mask to form gate trenches in the dielectric layer.

In one embodiment, a gate electrode layer is formed over the substrate. The gate electrode layer, for example, may be polysilicon. Other types of gate electrode layers may also be useful. The gate electrode layer fills the trenches and covers the lower cell dielectric layer. The gate electrode layer may be formed by, for example, CVD. Other techniques for forming the gate electrode layer may also be useful. Excess gate electrode materials are removed by a planarization process. For example, a CMP process removes excess gate electrode material, leaving gate conductors in the gate trenches. In one embodiment, the planarization process forms a planar top surface with the gates 112 and lower cell dielectric layer 272. The gate conductors, for example, are gates of select transistors of memory cells. Other configurations of the top surfaces of the gates and lower cell dielectric layer may also be useful. For example, the surfaces may be non-coplanar with respect to each other.

Figure 5B:
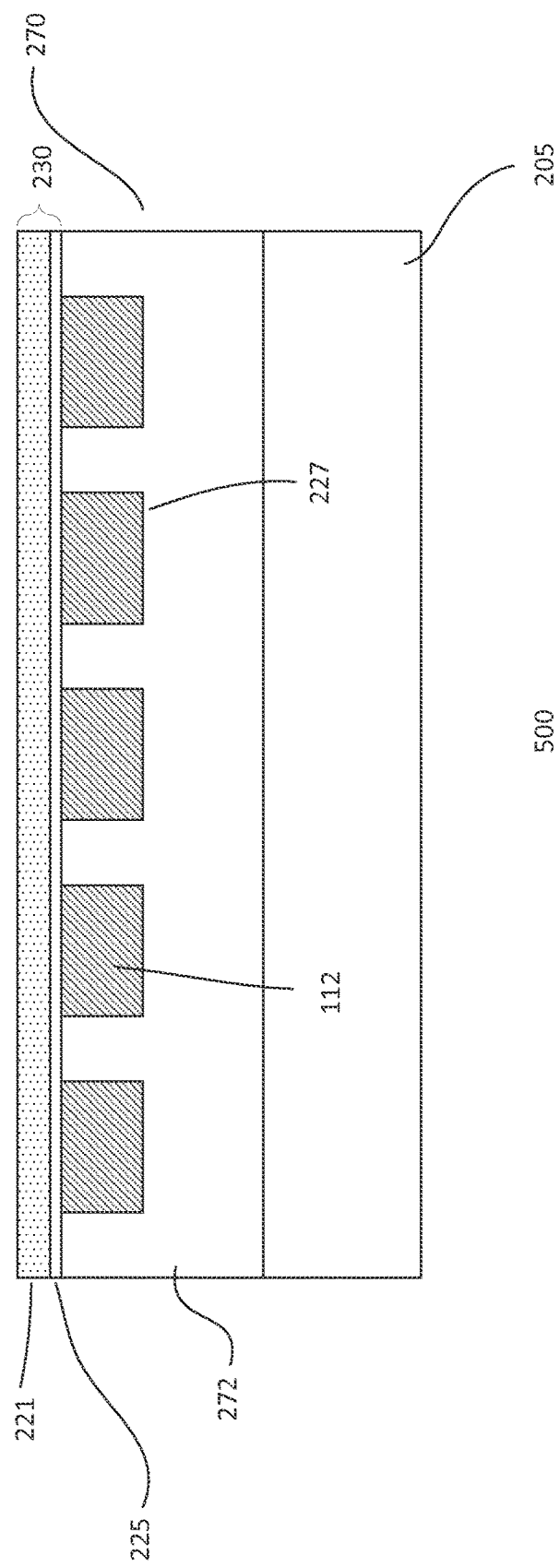

As shown in FIG. 5b, body unit layers are formed on the substrate, covering the gates and lower cell dielectric layer. In one embodiment, a gate dielectric layer 225 is formed on the substrate over the lower cell dielectric layer and gates. The gate dielectric layer, for example, may be silicon oxide. In one embodiment, the silicon oxide is a high temperature oxide. Other types of gate dielectric materials may also be useful. The gate dielectric layer may be formed by CVD. Forming the gate dielectric layer with other techniques may also be useful.

A body layer 221 is formed on the gate dielectric layer. The body layer may be a semiconductor layer. In one embodiment, the body layer is silicon. For example, the body layer may be polysilicon. Other types of semiconductor layers may be also useful to serve as a body layer. The body layer may be formed by CVD. Forming the body layer by other techniques may also be useful. The body layer may be formed as a polycrystalline layer or an amorphous layer. In the case of an amorphous layer, it is annealed to crystallize it. The body layer serves as the body of cell select transistors of memory cells. In one embodiment, the thickness of the body layer is equal to about 50 nm.

The body layer is doped with second polarity type dopants. For example, the body layer is doped with the opposite polarity as the transistor type. For example, the body layer is doped with p-type dopants for n-type transistors. In one embodiment, the body layer is lightly or intermediately doped with second polarity type dopants. The dopant concentration, for example, is about 1E12-1E13. Other dopant concentrations may also be useful. Doping the body layer may be achieved by implantation of dopants/ions or in-situ doping. For example, in the case of an amorphously deposited body layer, annealing may be performed after ion implantation.

In one embodiment, the body unit layers are patterned to form body unit conductors 230. The body unit conductors, for example, are elongated members disposed along a second or bitline BL direction. Other configurations of patterning the body unit layers may also be useful. For example, in some cases, the body layer (without the gate dielectric layer) is patterned to form body conductors along the second direction.

Figure 5C:
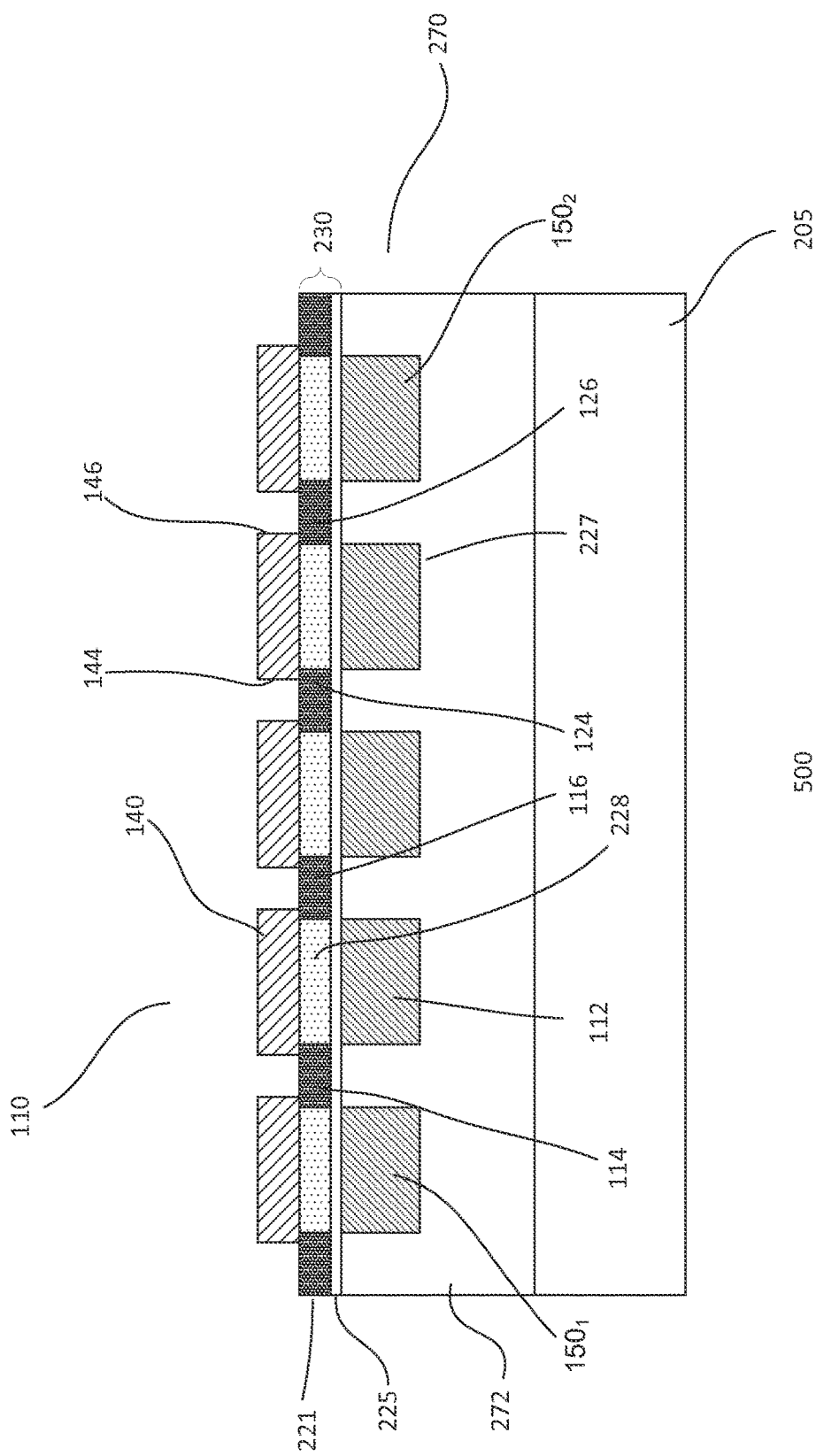

Storage units, in one embodiment, are formed on the substrate, disposed over the body layer, as shown in FIG. 5c. The storage units may be resistive storage units. In one embodiment, the resistive storage units are thermal-based resistive storage units. Alternatively, the resistive storage units are non-thermal based resistive storage units. Other types of storage units may also be useful.

In one embodiment, forming storage units includes depositing a storage element 140 layer on the substrate, covering the lower cell dielectric layer and body units. The storage element layer may be a composite storage element layer. For example, the storage element layer may include a plurality of storage element sub-layers. The storage element layer is patterned to form storage element conductors. The storage element conductors are disposed in the first or wordline direction. Patterning the storage element layer may be achieved using mask and etch techniques. For example, a patterned soft mask, such as photoresist may be used to serve as an etch mask for an anisotropic etch, such as a reactive ion etch (RIE). The use of a hard mask as an etch mask may also be useful. For example, the hard mask may be patterned by a soft mask.

After forming the storage element conductors, a storage electrode layer may be formed on the substrate. The electrodes may be formed of an ECM. The type of ECM material may, for example, depend on the type of resistive element of the storage units. The electrode may be a composite electrode. For example, in the case of a PCM storage unit, the electrodes may be a composite electrode, including a heater. The heater may be a low conductive ECM, such as TiN while the electrode may be TaN. In the case of a Re-RAM, the electrode may be an electrode stack, such as $TiON/SiO_2$, or a transition-metal oxide (TMO), such as HfO and ZrO. Other types of ECMs or configurations of electrodes may also be useful.

The storage electrode layer is patterned to form electrodes on sidewalls of the storage element conductors. In one embodiment, an isotropic etch is performed, removing horizontal portions of the electrode layer, leaving electrodes on sides of the storage element conductors. For example, portions of the electrode layer along the direction of the wafer surface are removed. The electrodes serve as first and second terminals 144 and 146 of the storage unit conductors.

As shown, a width of the storage unit is slightly wider than a width of the gates. For example, sidewalls of the storage units extend outside sidewalls of the gates. This improves process window, such as misalignment, to ensure that the terminals of the storage unit are coupled to the terminals or S/D regions of the transistor.

In some embodiments, the transistor body may serve as a heating element. For example, the PC element and the transistor body, which serves as the heating element, are provided. In such cases, no electrode layer may be needed.

First and second S/D regions 124 and 126 are formed in the transistor body layer. In one embodiment, the S/D regions are formed by ion implantation. For example, first polarity type dopants are implanted into the body layer to form S/D regions. The S/D implant, for example, is self-aligned to the storage unit conductors, forming heavily doped first polarity type S/D regions in the body layer adjacent to sides of the gates and storage units. The S/D regions may occupy the complete depth or thickness of the body layer. Providing S/D regions which occupy partially the depth of the body layer may also be useful. Other configurations of S/D regions may also be useful. In some embodiments, the S/D regions may be the same as the transistor body. For example, the S/D regions may be doped with the same dopant type and dopant concentration as the transistor body. In such cases, first polarity type dopants are not implanted into the transistor body to form S/D regions.

Between the S/D regions in the transistor body layer is a channel 228 of a cell select transistor. The S/D regions form memory cells 110 having a cell select transistor coupled in parallel with a storage unit. The S/D regions, for example, serve as cell terminals 114 and 116 of the memory cells.

A body unit provides a body for a column of memory cells. The memory cells of a column are coupled in series. For example, a second terminal of one memory cell is coupled to a first terminal of an adjacent memory cell. The memory cells are disposed between first and second column selectors $150_1$-$150_2$. The column selectors, for example, are transistors, such as MOS transistors. In one embodiment, a column selector has the same structure as a memory cell. For example, the column selectors may be formed in the same process as forming the memory cells. Other types of column selectors or transistors may also be useful.

A column selector includes first and second S/D regions disposed in the body layer on first and second sides of the gate. The S/D regions are, for example, heavily doped regions with first polarity type dopants. Other configurations of S/D regions of the column selectors may also be useful. As shown, the second S/D of the first column selector is common with the first S/D of the first memory cell of a column while the first S/D of the second column selector is common with the second S/D of a last memory cell of the column. The first S/D region of the first column select transistor may be referred to as a drain region or terminal and the second S/D region of the second column select transistor may be referred to as a source region or terminal. In some embodiments, drain and source regions of the first and second column selectors are coupled to BL and SL respectively.

In one embodiment, at least the drain and source regions coupled to the BL and SL are heavily doped with first polarity type dopants. The heavily doped regions are formed by, for example, ion implantation of first polarity type dopants into the drain region of the first column selector and source region of the second cell selector. For example, the BL and SL are coupled to heavily doped drain and source regions of a first polarity.

In some embodiments, the second S/D region of the first column selector and first S/D region of the second column selector may be the same as the transistor body. For example, the S/D regions may be doped with the same dopant type and dopant concentration as the transistor body. These S/D regions may be the same configurations as the S/D regions of the cell selectors of the memory cells. In such cases, the S/D regions are protected from ion implantation to form the S/D regions coupled to the BL and SL. For example, a resist or implant mask may protect the S/D regions of the memory cells while the S/D regions coupled to the BL and SL are exposed, enabling dopants to be implanted. Other configurations of forming S/D regions may also be useful. For example, both first and second S/D regions of the first and second column selectors may be heavily doped with first polarity type dopants.

After forming S/D regions, metal silicide contacts may be formed thereon. Forming silicide contacts include, for example, depositing a metal layer, such as nickel or nickel alloy on the substrate covering the S/D regions. An anneal is performed to cause a reaction with the metal and silicon of the body layer, forming metal silicide contacts on the S/D regions. Unreacted metal, such as that over the storage layer, are removed by, for example, a wet etch. Other techniques of forming metal silicide contacts may also be useful.

Figure 5D:
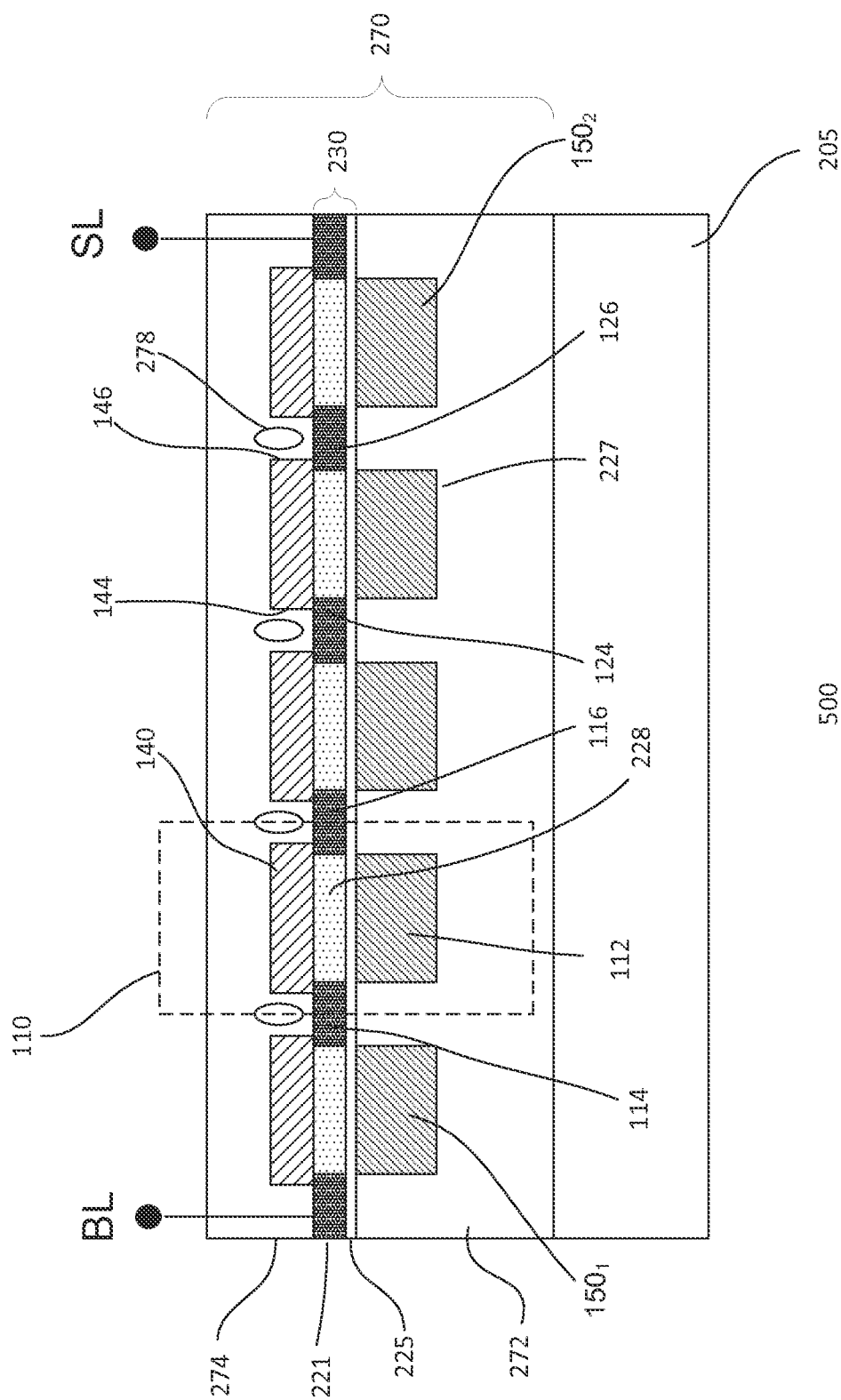

Referring to FIG. 5d, an upper cell dielectric layer 274 is formed over the substrate, covering the lower cell dielectric layer, body units and storage units. The upper cell dielectric layer, for example, may be silicon oxide. Other types of dielectric material may also be useful. Preferably, the upper cell dielectric layer is formed of the same material as the lower cell dielectric layer. The cell dielectric layer may also be formed of the same material as the ILD layer. Other configurations of cell dielectric and ILD layers may also be useful.

The dielectric layer, for example, may be deposited by CVD. Other techniques for forming the dielectric layer may also be useful. A planarizing process may be performed. The planarizing process, for example, may include chemical mechanical polishing (CMP). Other types of planarizing process may also be useful. The planarizing process produces a planar surface for the dielectric layer.

In one embodiment, the upper cell dielectric layer is formed to include voids 278. As shown, voids are formed between adjacent storage conductors. Providing voids improve isolation between storage units within a row of memory cells. The voids, for example, may form as a result of imperfect gap fill. Alternatively, the upper cell dielectric layer may not include voids.

The process continues to form the device. The processing may include forming metal layers of the device. The metal layers include interconnections to the various components of the device, including various conductive lines coupled to the various terminals of the memory cells and column selectors. For example, the metal layers include BLs, WLs, SLs, SSLs and GSLs. Lines which are of the same direction may be formed in the same metal layer, while lines of different directions may be formed in a different metal layer. Other configurations of lines and metal layers may also be useful. Additional processing, such as silicidation, final passivation, dicing, assembly and packaging may be performed. Other processes may also be included.

FIGS. 6a-6d show cross-sectional views of an embodiment of a process for forming a device or IC 600. The device, for example, includes memory cells 110. The memory cells, in one embodiment, are NVM cells. The memory cells may be resistive type memory cells. Other types of memory cells may also be useful. The memory cells may be similar to those described in FIG. 1, FIGS. 2a-2b, FIGS. 3a-3b and FIGS. 5a-5d. Common elements may not be described or described in detail. The cross-sectional view is along A-A' which is along a second or wordline direction.

Referring to FIG. 6a, a substrate 205 is shown. The substrate, for example, is a semiconductor substrate, such as a silicon substrate. Other types of substrates may also be useful. The substrate includes an array region for memory cells. Other regions (not shown) may also be provided. Transistors may be formed on the substrate corresponding to the different regions.

In one embodiment, the substrate includes a dielectric layer 272. The dielectric layer is disposed on devices or transistors formed on the substrate. The dielectric layer, for example, serves as a lower cell dielectric layer of a cell dielectric layer 270. The cell dielectric layer, for example, is silicon oxide. Other types of cell dielectric materials, such as those used in ILD layer of the device may also be useful. The lower cell dielectric layer is patterned to form trenches 227, such as gate trenches.

A gate electrode layer, in one embodiment, is formed over the substrate. The gate electrode layer, for example, may be polysilicon. Other types of gate electrode layers may also be useful. The gate electrode layer fills the trenches and covers the lower cell dielectric layer. The gate electrode layer may be formed by, for example, CVD. Other techniques for forming the gate electrode layer may also be useful. Excess gate electrode materials are removed by a planarization process. For example, a CMP process removes excess gate electrode material, leaving gate conductors in the gate trenches. In one embodiment, the planarization process forms a planar top surface with the gates and lower cell dielectric layer. The gate conductors, for example, are gates 112 of select transistors of memory cells.

In one embodiment, the gate electrodes are recessed. For example, top surfaces of the gate electrodes are recessed below the top surface of the lower cell dielectric layer. Recessing the gate electrodes may be achieved by, for example, an etch. The recess etch may be an anisotropic etch, such as RIE. Recessing the gate electrodes using an isotropic etch, such as a wet etch, may also be useful. Other techniques for recessing the gate electrodes may also be useful. The depth of the recess, for example, may be about 20-40% of the gate height. Other depths may also be useful. The recessing of the gate electrodes creates topography, forming gate electrode recesses and dielectric mesas.

Figure 6B:
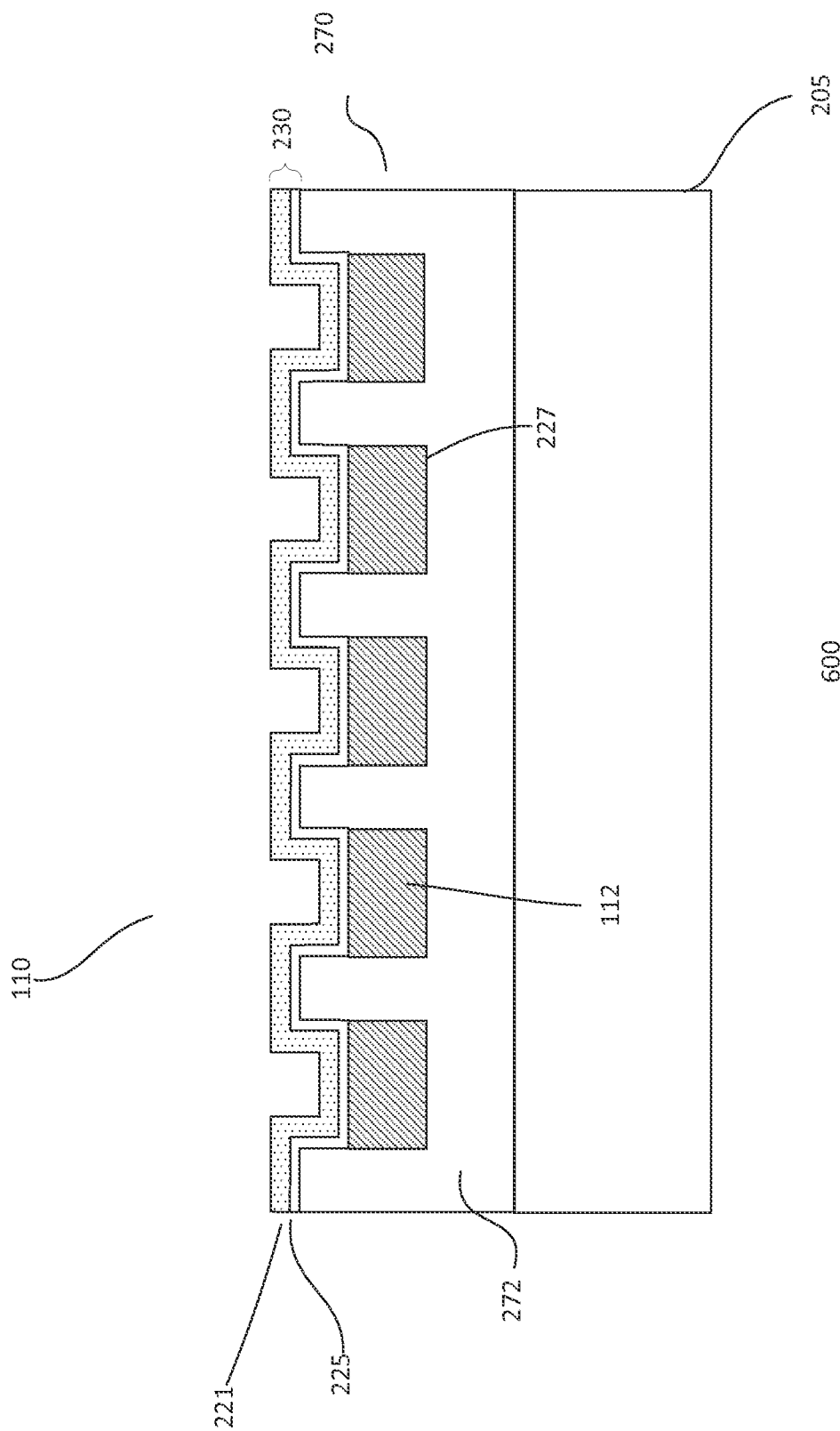

In FIG. 6b, body unit layers are formed on the substrate, covering the gates and lower cell dielectric layer. The body unit layers, for example, are conformal layers, tracking the underlying topography. As shown, the body unit layers form body unit recesses and body unit mesas.

In one embodiment, a gate dielectric layer 225 is formed on the substrate over the lower cell dielectric layer and gate electrodes. The gate dielectric layer, for example, may be silicon oxide. In one embodiment, the gate dielectric layer is a high temperature oxide layer. Other types of gate dielectric materials may also be useful. The gate dielectric layer may be formed by CVD. Forming the gate dielectric layer by other techniques may also be useful.

A body layer 221 is formed on the gate dielectric layer. The body layer may be a semiconductor layer. In one embodiment, the body layer is silicon. For example, the body layer may be polysilicon. Other types of semiconductor layers may be also useful to serve as a body layer. The body layer may be formed by CVD. Forming the body layer by other techniques may also be useful. The body layer may be formed as a polycrystalline layer or an amorphous layer. In the case of an amorphous layer, it is annealed to crystallize it. The body layer serves as the body of cell select transistors of memory cells. In one embodiment, the thickness of the body layer is equal to about 50 nm. Other thicknesses may also be useful.

The body layer is doped with second polarity type dopants. The body layer is doped with the opposite polarity and the transistor type. For example, the body layer is doped with p-type dopants for n-type transistors. In one embodiment, the body layer is lightly or intermediately doped with second polarity type dopants. Doping the body layer may be achieved by implantation of dopants/ions or in-situ doping.

In one embodiment, the body unit layers are patterned to form body unit conductors 230. The body unit conductors, for example, may be disposed along a second or bitline BL direction. Other configurations of patterning the body unit layers may also be useful. For example, in some cases, the body layer is patterned to form body conductors along the second direction.

Figure 6C:
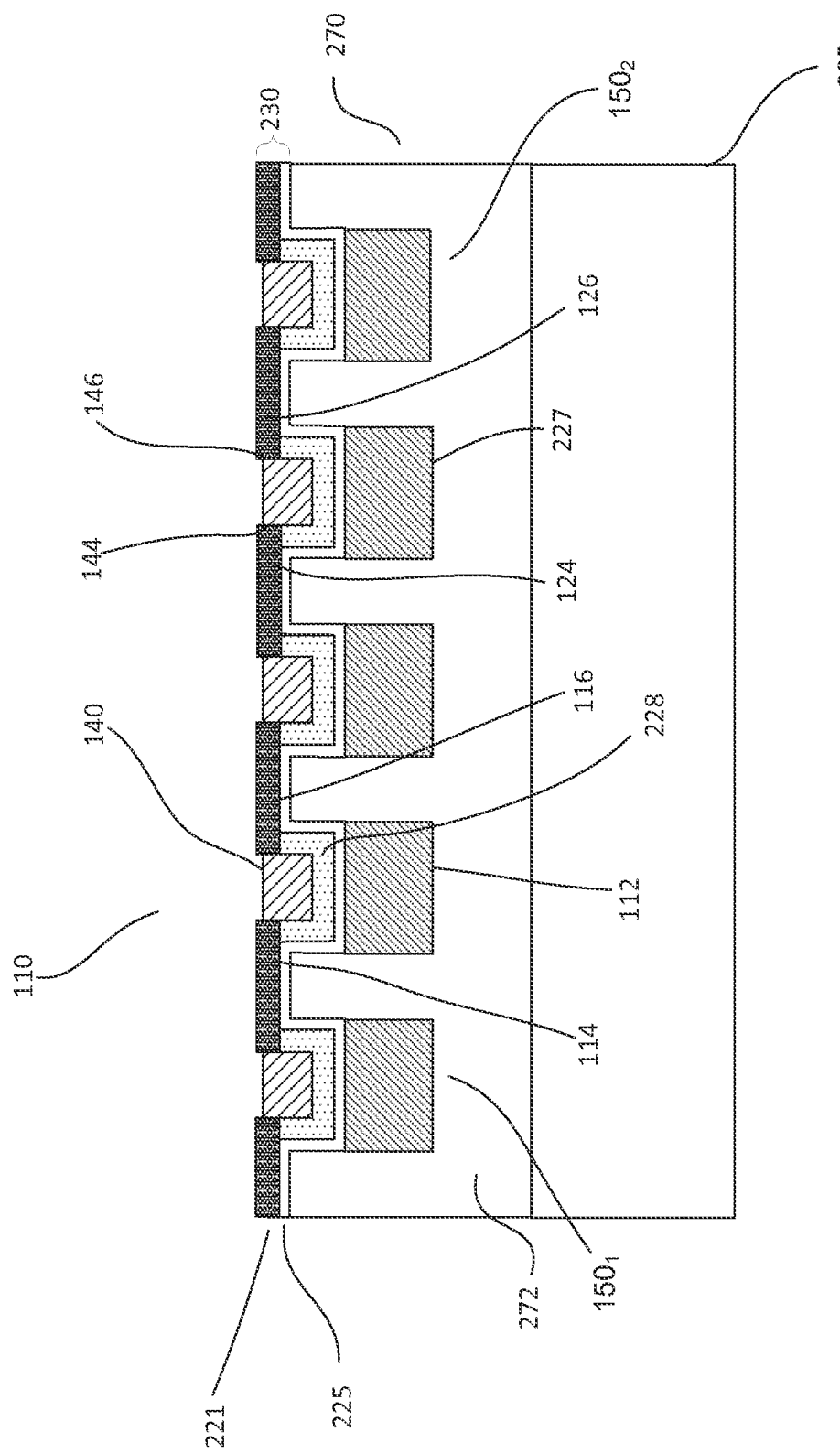

Referring to FIG. 6c, storage units are formed on the substrate. A storage unit includes a storage element 140 with first and second storage terminals 144 and 146. In one embodiment, the storage units are formed in the body unit recesses. The storage units have a top surface which equal to about the top surface body unit layers in the body mesas. The storage units, in one embodiment, are resistive storage units. In one embodiment, resistive storage units are thermal-based resistive storage units. Alternatively, the resistive storage units are non-thermal based resistive storage units.

In one embodiment, forming the storage units include forming a storage electrode layer on the substrate and lining the body layer. The storage electrode layer is conformal, following the underlying topography. An anisotropic etch, such as RIE, patterns the storage electrode layer, forming storage electrodes on sides of the body recess. For example, the RIE removes horizontal portions of the electrode layer, leaving electrode spacers in the sides of the body recess. The electrodes serve as first and second storage terminals of the storage units. In some embodiment, the electrode layer may be a composite electrode layer. For example, the electrode layer may include a heater layer to serve as heating elements for thermal based resistive storage units. In other embodiments, the heater may be provided by the body layer. In such cases, no electrode layer may be needed.

After forming the storage electrodes, a storage element layer is deposited on the substrate. The storage element layer fills the body recess and covers the body mesas. Excess storage element material is removed by, for example, a planarization process. In one embodiment, a CMP removes excess storage element material, leaving storage units in the body recesses. As shown, the CMP over polishes the storage element layer, slightly recessing a top surface of the storage units below the body layer. Other configurations of the storage unit surfaces may also be useful. For example, the top surface of the storage unit may be coplanar with the top of the body layer.

First and second S/D regions 124 and 126 are formed in the transistor body layer. In one embodiment, the S/D regions are formed by ion implantation. For example, first polarity type dopants are implanted into the body layer to form S/D regions. The S/D implant, for example, is self-aligned to the storage unit conductors, forming heavily doped first polarity type S/D regions in the body layer adjacent to sides of the gates and storage units. The S/D regions may occupy the complete depth or thickness of the body layer. Providing S/D regions which occupy partially the depth of the body layer may also be useful. Other configurations of S/D regions may also be useful. In some embodiments, the S/D regions may be the same as the transistor body. For example, the S/D regions may be doped with the same dopant type and dopant concentration as the channel and transistor body. In such cases, first polarity type dopants are not implanted into the transistor body to form S/D regions.

Between the S/D regions in the transistor body layer is a channel 228 of a cell select transistor. The S/D regions form memory cells 110 having a cell select transistor coupled in parallel with a storage unit. The S/D regions, for example, serve as cell terminals 114 and 116 of the memory cells.

A body unit provides a body for a column of memory cells. The memory cells of a column are coupled in series. For example, a second terminal of one memory cell is coupled to a first terminal of an adjacent memory cell. The memory cells are disposed between first and second column selectors $150_1$-$150_2$. The column selectors, for example, are transistors, such as MOS transistors. In one embodiment, a column selector has the same structure as a memory cell. For example, the column selectors may be formed in the same process as forming the memory cells. Other types of column selectors or transistors may also be useful.

A column selector includes first and second S/D regions disposed in the body layer on first and second sides of the gate. The S/D regions are, for example, heavily doped regions with first polarity type dopants. Other configurations of S/D regions of the column selectors may also be useful. As shown, the second S/D of the first column selector is common with the first S/D of the first memory cell of a column while the first S/D of the second column selector is common with the second S/D of a last memory cell of the column. The first S/D region of the first column select transistor may be referred to as a drain region or terminal and the second S/D region of the second column select transistor may be referred to as a source region or terminal. In some embodiments, drain and source regions of the first and second column selectors are coupled to BL and SL respectively.

In one embodiment, at least the drain and source regions coupled to the BL and SL are heavily doped with first polarity type dopants. The heavily doped regions are formed by, for example, ion implantation of first polarity type dopants into the drain region of the first column selector and source region of the second cell selector. For example, the BL and SL are coupled to heavily doped drain and source regions of a first polarity.

In some embodiments, the second S/D region of the first column selector and first S/D region of the second column selector may be the same as the transistor body. For example, the S/D regions may be doped with the same dopant type and dopant concentration as the transistor body. These S/D regions may be the same configurations as the S/D regions of the cell selectors of the memory cells. In such cases, the S/D regions are protected from ion implantation to form the S/D regions coupled to the BL and SL. For example, a resist or implant mask may protect the S/D regions of the memory cells while the S/D regions coupled to the BL and SL are exposed, enabling dopants to be implanted. Other configurations of forming S/D regions may also be useful. For example, both first and second S/D regions of the column selectors may be heavily doped with first polarity type dopants.

After forming S/D regions, metal silicide contacts may be formed thereon. Forming silicide contacts includes, for example, depositing a metal layer, such as nickel or nickel alloy on the substrate covering the S/D regions. An anneal is performed to cause a reaction with the metal and silicon of the body layer, forming metal silicide contacts on the S/D regions. Unreacted metal, such as over the storage layer, are removed by, for example, a wet etch. Other techniques of forming metal silicide contacts may also be useful.

Figure 6D:
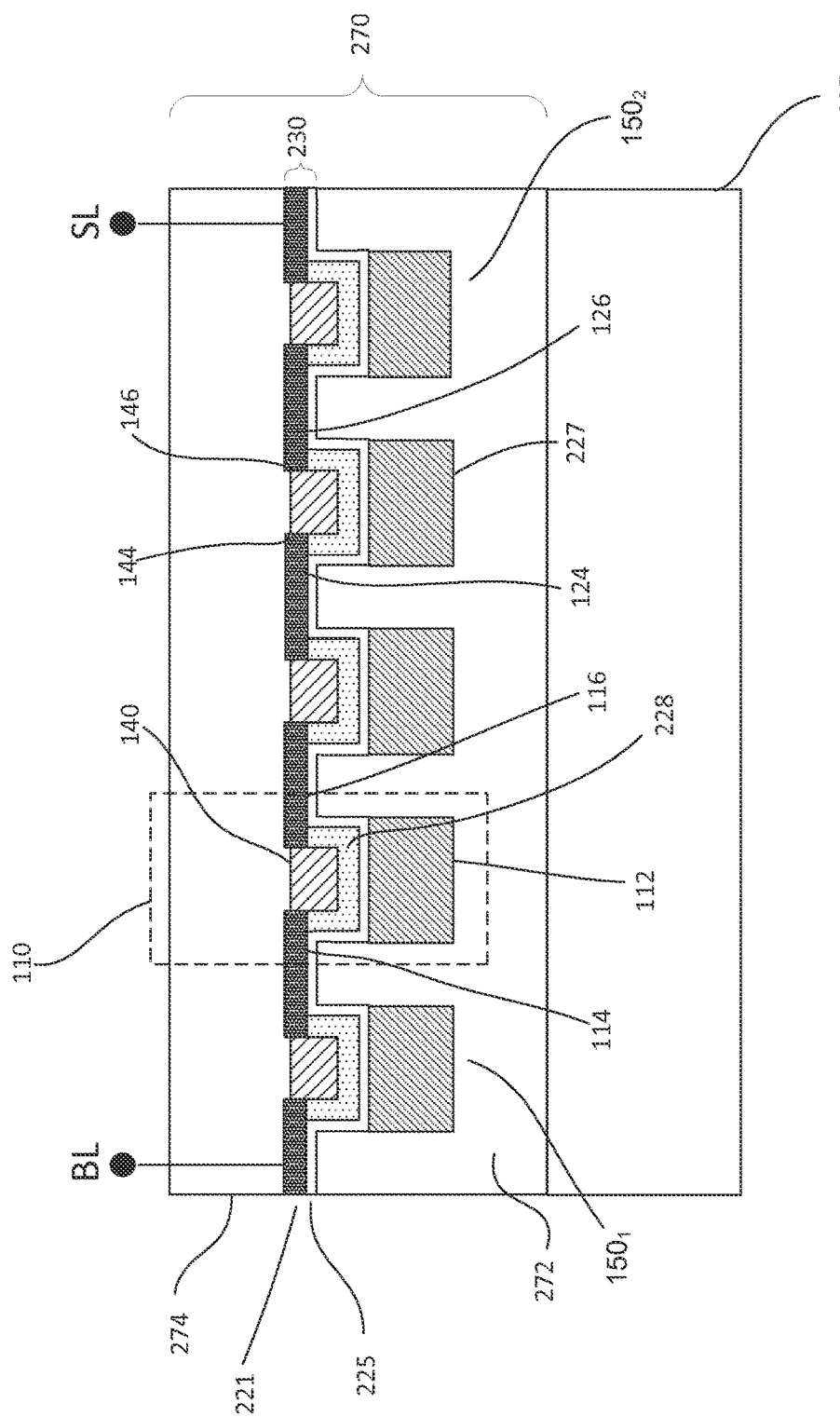

Referring to FIG. 6d, an upper cell dielectric layer 274 is formed over the substrate, covering the lower cell dielectric layer, body units and storage units. The upper cell dielectric layer, for example, is silicon oxide. Other types of cell dielectric materials may also be useful. The dielectric layer, for example, may be deposited by CVD. Other techniques for forming the dielectric layer may also be useful. A planarizing process may be performed. The planarizing process, for example, may include CMP. Other types of planarizing process may also be useful. The planarizing process produces a planar surface for the dielectric layer.

The process continues to form the device. The processing may include forming metal layers of the device. The metal layers include interconnections to the various components of the device, including various conductive lines coupled to the various terminals of the memory cells and column selectors. For example, the metal layers include BLs, WLs, SLs, SSLs and GSLs. Lines which are of the same direction may be formed in the same metal layer, while lines of different directions may be formed in a different metal layer. Other configurations of lines and metal layers may also be useful. Additional processing, such as silicidation, final passivation, dicing, assembly and packaging may be performed. Other processes may also be included.

FIGS. 7a-7f show cross-sectional views of an embodiment of a process for forming a device or IC 700. The device, for example, includes memory cells 110. The memory cells, in one embodiment, are NVM cells. The memory cells may be resistive type memory cells. Other types of memory cells may also be useful. The memory cells may be similar to those described in FIG. 1, FIGS. 2a-2b, FIGS. 3a-3b, FIGS. 4a-4b, FIGS. 5a-5d, and FIGS. 6a-6d. Common elements may not be described or described in detail. The cross-sectional view is along A-A' which is along a second or wordline direction.

Figure 7A:
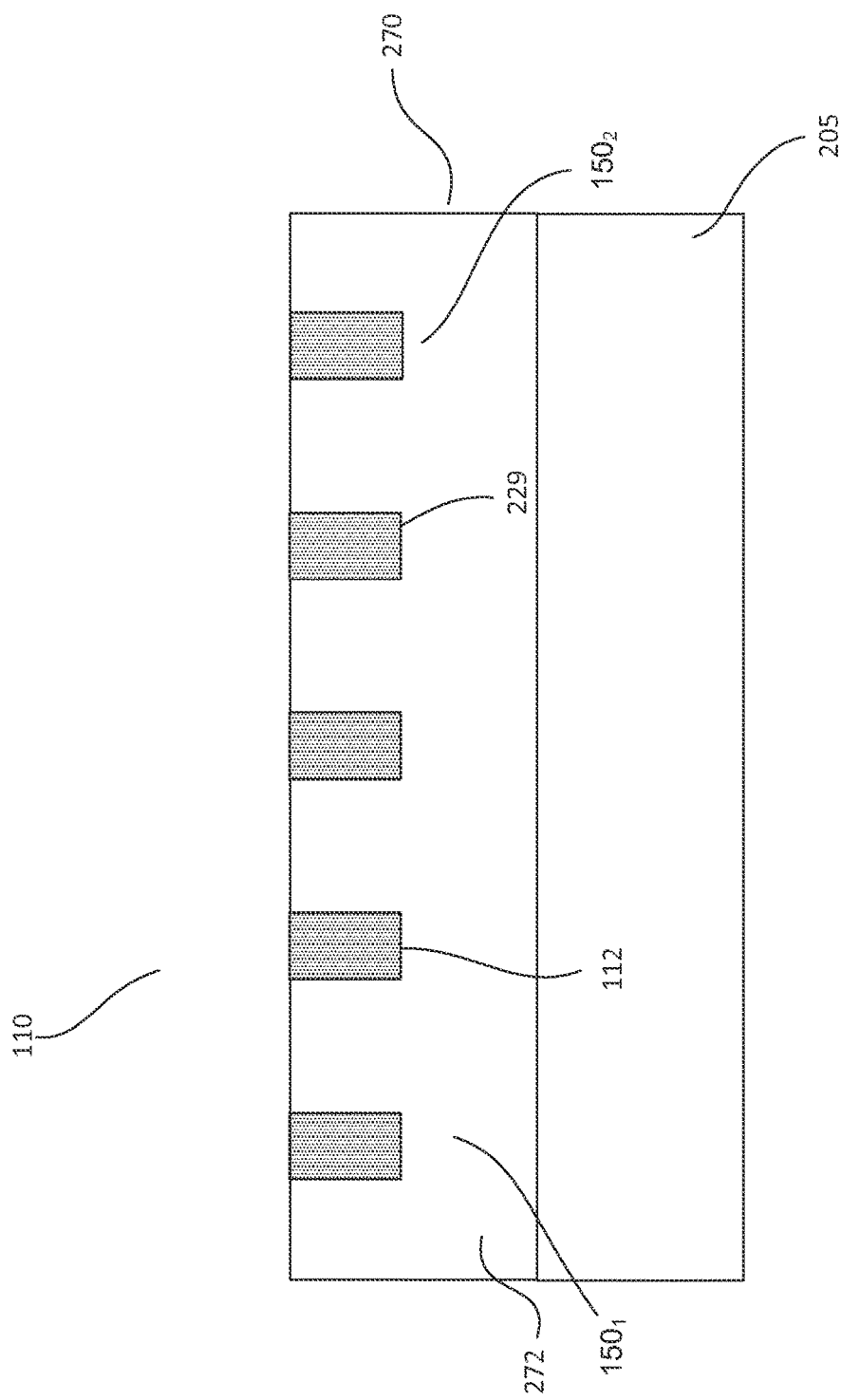

Referring to FIG. 7a, a substrate 205 is shown. The substrate, for example, is a semiconductor substrate, such as a silicon substrate. Other types of substrates may also be useful. The substrate includes an array region for memory cells. Other regions (not shown) may also be provided. Transistors may be formed on the substrate corresponding to the different regions.

In one embodiment, the substrate includes a dielectric layer 272. The dielectric layer is disposed on devices or transistors formed on the substrate. The dielectric layer, for example, serves as a lower cell dielectric layer of a cell dielectric layer 270. The cell dielectric layer, for example, is silicon oxide. Other types of cell dielectric materials, such as those used in ILD layer of the device may also be useful. The lower cell dielectric layer is patterned to form, for example, gate trenches 229. The spacing between the trenches should be sufficient to provide separation for memory cells. For example, the ratio of trench and trench spacing may be about 1:1. Other ratios may also be useful.

A gate electrode layer is formed over the substrate. The gate electrode layer, for example, may be polysilicon. Other types of gate electrode layers may also be useful. The gate electrode layer fills the trenches and covers the lower cell dielectric layer. The gate electrode layer may be formed by, for example, CVD. Other techniques for forming the gate electrode layer may also be useful. Excess gate electrode material is removed by a planarization process. For example, a CMP process removes excess gate electrode material, leaving gate conductors in the gate trenches. In one embodiment, the planarization process forms a planar top surface with the gate conductors and lower cell dielectric layer. The gate conductors, for example, are gates 112 of select transistors of memory cells.

As shown in FIG. 7b, the lower cell dielectric layer is recessed. For example, top surfaces of the dielectric layer are recessed below the top surface of the gate conductors. Recessing the dielectric layer may be achieved by, for example, an etch. The recess etch may be an isotropic etch, such as a wet etch. For example, the etch may be a wet etch selective to the gate material. Recessing the dielectric layer using other techniques, such as an anisotropic etch, may also be useful. Other techniques for recessing the dielectric layer may also be useful. The recessing of the dielectric layer creates topography, forming gate mesas protruding above the dielectric layer.

Figure 7C:
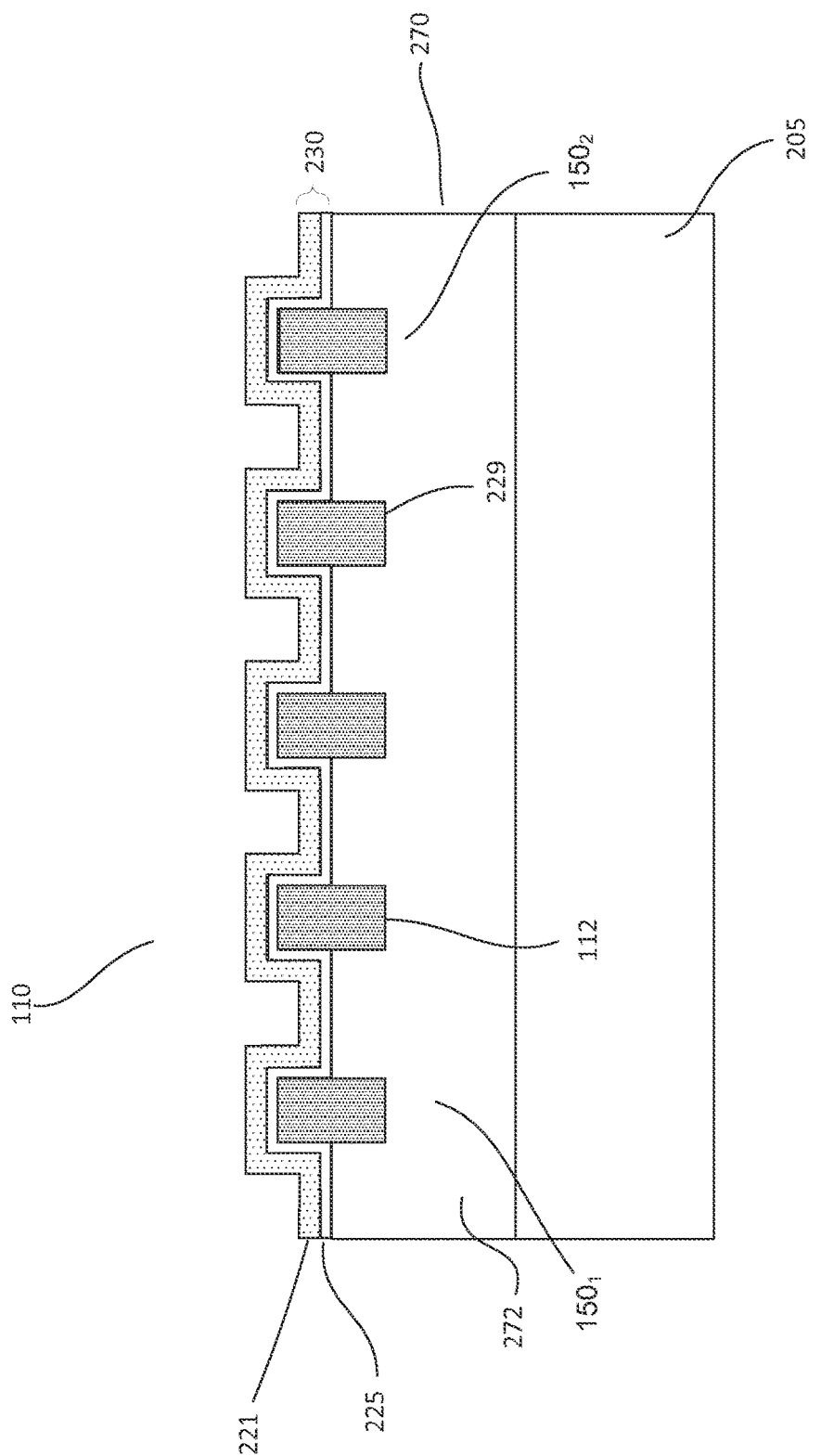

In FIG. 7c, body unit layers are formed on the substrate, covering the gates and lower cell dielectric layer. The body unit layers, for example, are conformal layers, tracking the underlying topography. For example, the body unit layers form body unit recesses and body unit mesas.

In one embodiment, a gate dielectric layer 225 is formed on the substrate over the lower cell dielectric layer and gates. The gate dielectric layer, for example, may be silicon oxide. In one embodiment, the gate dielectric layer is a high temperature oxide layer. Other types of gate dielectric materials may also be useful. Forming the gate dielectric layer with other techniques may also be useful.

A body layer 221 is formed on the gate dielectric layer. The body layer may be a semiconductor layer. In one embodiment, the body layer is silicon. For example, the body layer may be polysilicon. Other types of semiconductor layers may be also useful to serve as a body layer. The body layer may be formed by CVD. Forming the body layer by other techniques may also be useful. The body layer maybe formed as a polycrystalline layer or an amorphous layer. In the case of an amorphous layer, it is annealed to crystallize it. The body layer serves as the body of cell select transistors of memory cells. The thickness of the body layer, for example, may be about 50 nm. Other thicknesses may also be useful. For example, the thickness of the body layer may be equal to a thickness of the depth of the S/D regions and channel thickness.

The body layer is doped with second polarity type dopants. The body layer is doped with the opposite polarity and the transistor type. For example, the body layer is doped with p-type dopants for n-type transistors. In one embodiment, the body layer is lightly or intermediately doped with second polarity type dopants. Doping the body layer may be achieved by implantation of dopants/ions or in-situ doping.

In one embodiment, the body unit layers are patterned to form body unit conductors 230. The body unit conductors, for example, may be disposed along a second or bitline BL direction. Other configurations of patterning the body unit layers may also be useful. For example, in some cases, the body layer is patterned to form body conductors along the second direction.

Figure 7D:
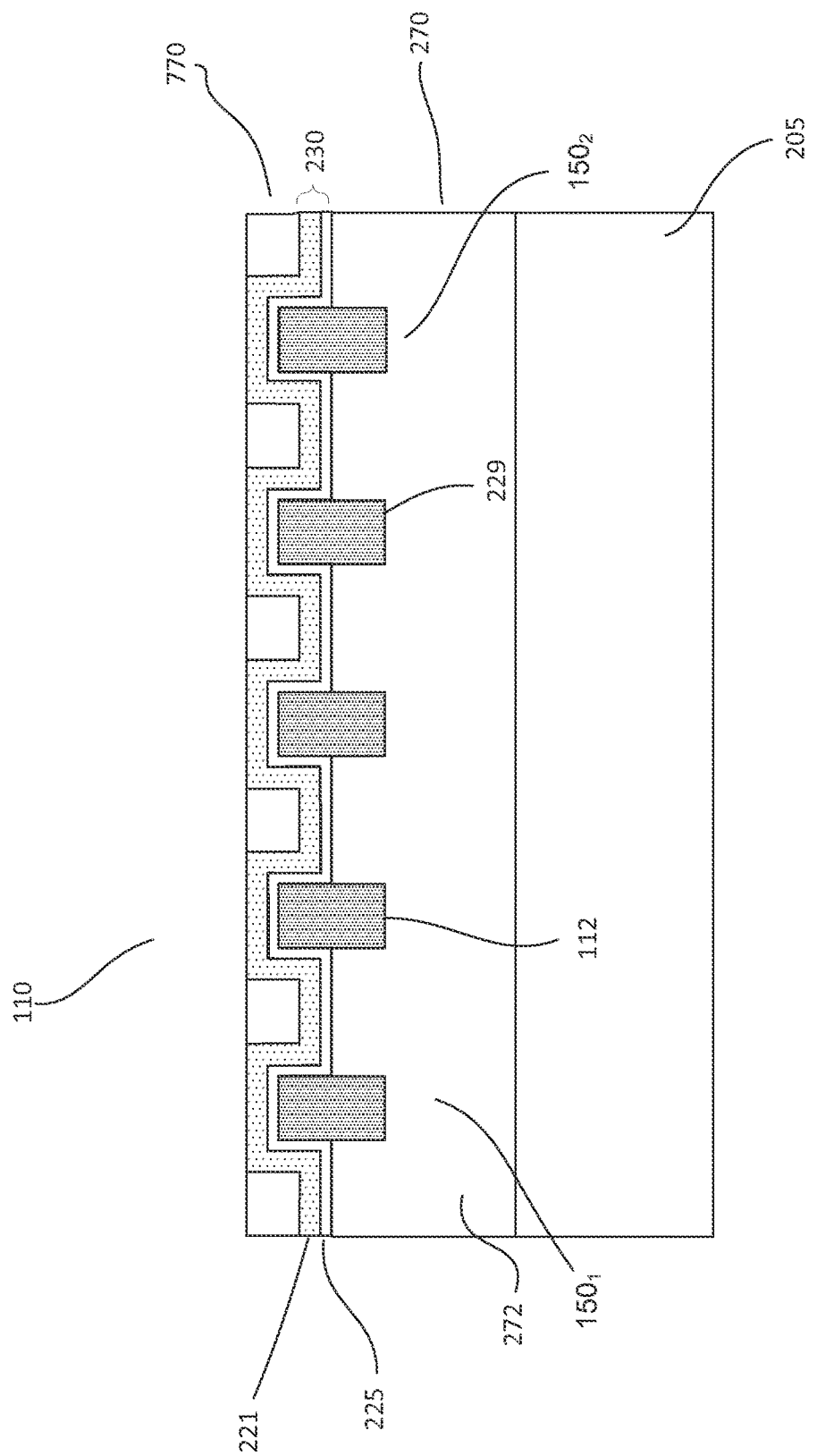

Referring to FIG. 7d, a filler dielectric layer 770 is formed on the substrate. The filler dielectric layer, for example, may be silicon oxide. For example, the filler dielectric layer may be similar to the lower cell dielectric layer. Providing a filler dielectric layer which is different from that of the lower cell dielectric layer may also be useful. The filler dielectric layer fills the recesses and covers the body mesas. A planarization process, such as CMP, removes excess filler dielectric layer, leaving dielectric fills in the recesses. The dielectric fills, in one embodiment, have top surfaces which are coplanar with the top surface of the body layer.

Figure 7E:
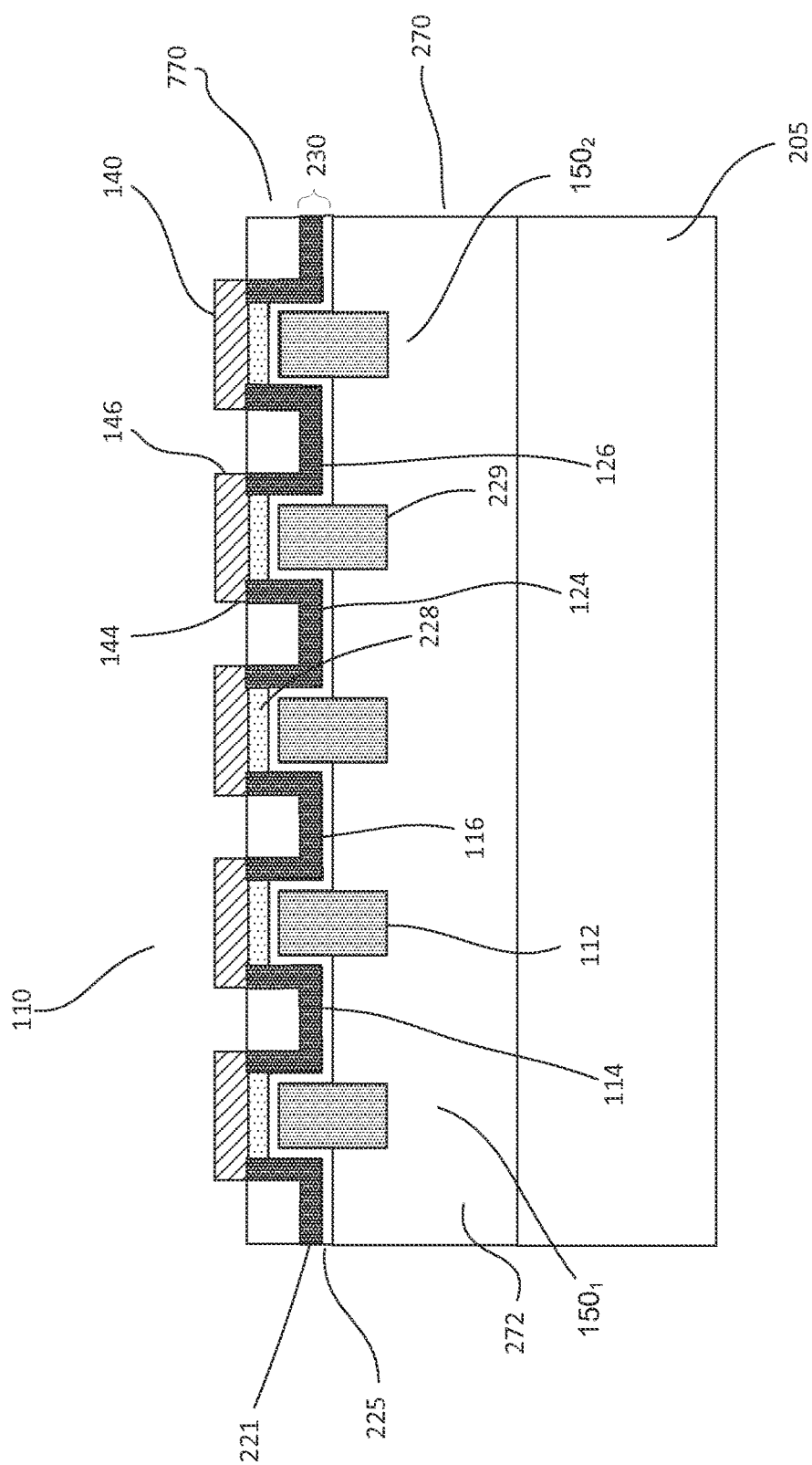

Referring to FIG. 7e, storage units are formed on the substrate, disposed over the body layer. The storage units, in one embodiment, are resistive storage units. In one embodiment, the resistive storage units are thermal-based resistive storage units. Alternatively, the resistive storage units are non-thermal based resistive storage units. First and second S/D regions are formed in the body layer. Forming the storage units and S/D regions may be similar to that described in, for example, FIG. 5c.

A width of the storage unit is wider than a width of the gates. For example, sidewalls of the storage units extend outside sidewalls of the gates. As shown, the width of the storage unit is about the same as the body mesas. Other widths for the storage units may also be useful.

Figure 7F:
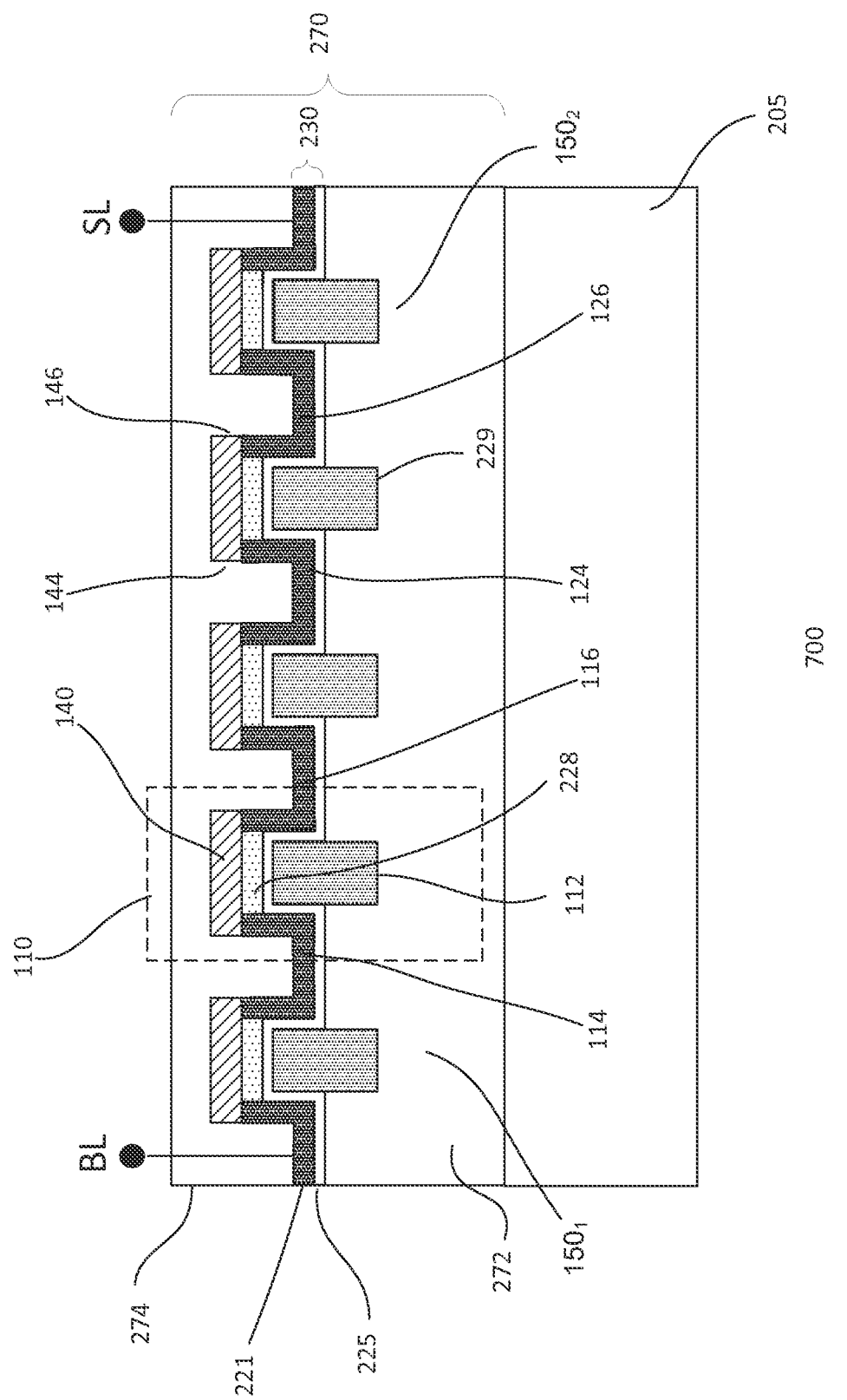

Referring to FIG. 7f, an upper cell dielectric layer 274 is formed over the substrate, covering the lower cell dielectric layer, body units and storage units. The upper cell dielectric layer, for example, is silicon oxide. Other types of cell dielectric materials may also be useful. For example, the lower cell dielectric layer may be of the same dielectric material as that used in an ILD layer of the device. The dielectric layer, for example, may be deposited by CVD. Other techniques for forming the dielectric layer may also be useful. A planarizing process may be performed. The planarizing process, for example, may include CMP. Other types of planarizing process may also be useful. The planarizing process produces a planar surface for the dielectric layer.

In one embodiment, the upper cell dielectric layer is formed to include voids (not shown), as described in, for example, FIG. 5d. Providing an upper cell dielectric layer without voids may also be useful.

The process continues to form the device. The processing may include forming metal layers of the device. The metal layers include interconnections to the various components of the device, including various conductive lines coupled to the various terminals of the memory cells and column selectors. For example, the metal layers include BLs, WLs, SLs, SSLs and GSLs. Lines which are of the same direction may be formed in the same metal layer, while lines of different directions may be formed in a different metal layer. Other configurations of lines and metal layers may also be useful. Additional processing, such as silicidation, final passivation, dicing, assembly and packaging may be performed. Other processes may also be included.

FIGS. 8a-8e show cross-sectional views of an embodiment of a process for forming a device or IC 800. The device, for example, includes memory cells 110. The memory cells, in one embodiment, are NVM cells. The memory cells may be resistive type memory cells. Other types of memory cells may also be useful. The memory cells may be similar to those described in FIGS. 7a-7f as well as others described herein. Common elements may not be described or described in detail. The cross-sectional view is along A-A' which is along a second or wordline direction.

Figure 8A:
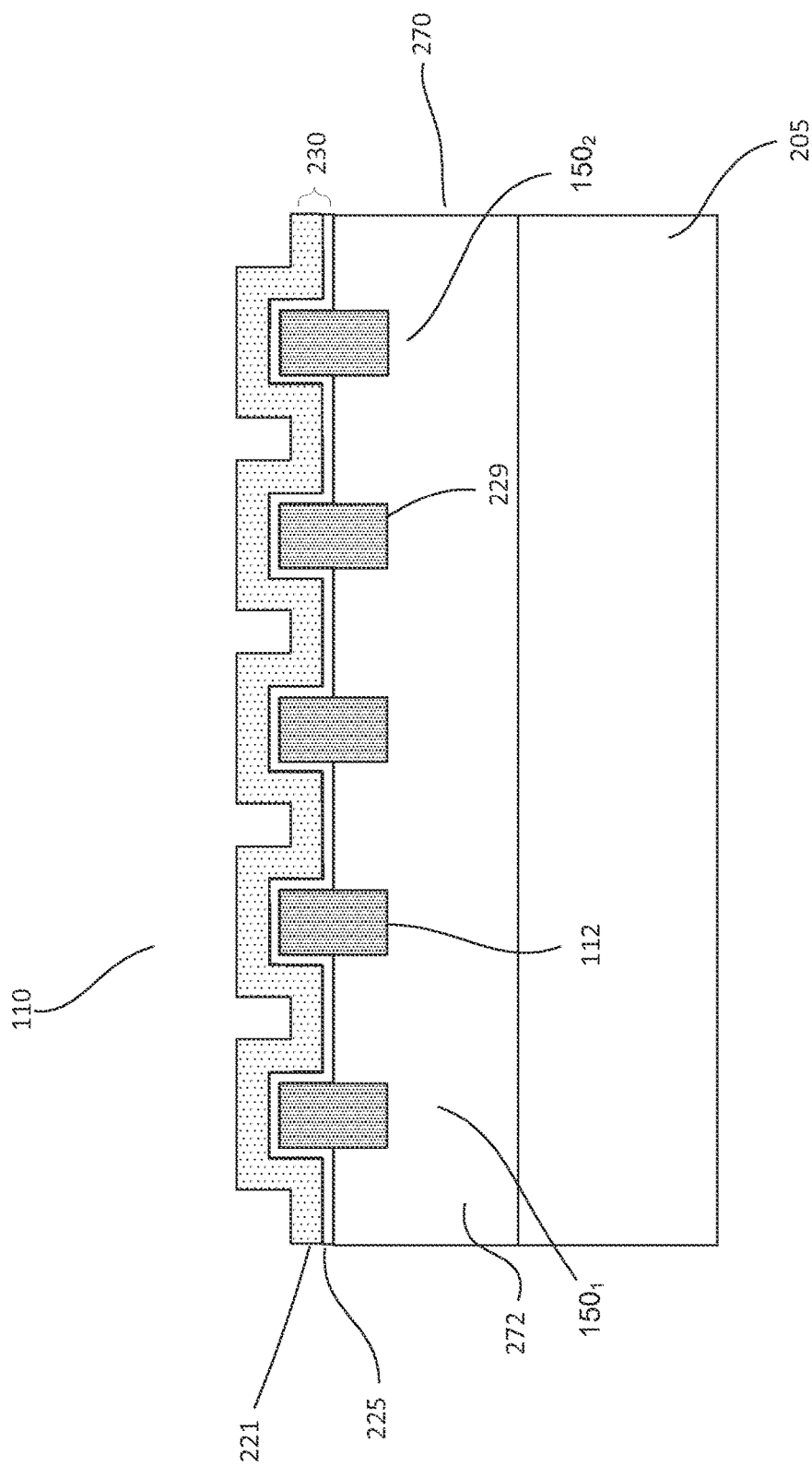
FIGS. 8a-8e show cross-sectional views of another embodiment of a process for forming a device of FIGS. 4a-4b.

Referring to FIG. 8a, a substrate 205 is shown. The substrate, for example, is a semiconductor substrate, such as a silicon substrate. Other types of substrates may also be useful. The substrate includes an array region for memory cells. Other regions (not shown) may also be provided. Transistors may be formed on the substrate corresponding to the different regions. The substrate is processed to the stage similar to that described in, for example, FIG. 7c. However, the body layer 221 is formed with a thickness equal to the desired thickness of the select transistor channels and desired thickness of the storage units. For example, the body layer is thicker than the transistor channels. In one embodiment, the body unit layers are patterned to form body unit conductors 230. The body unit conductors, for example, may be disposed along a second or bitline BL direction. Other configurations of patterning the body unit layers may also be useful. For example, in some cases, the body layer is patterned to form body conductors along the second direction.

Figure 8B:
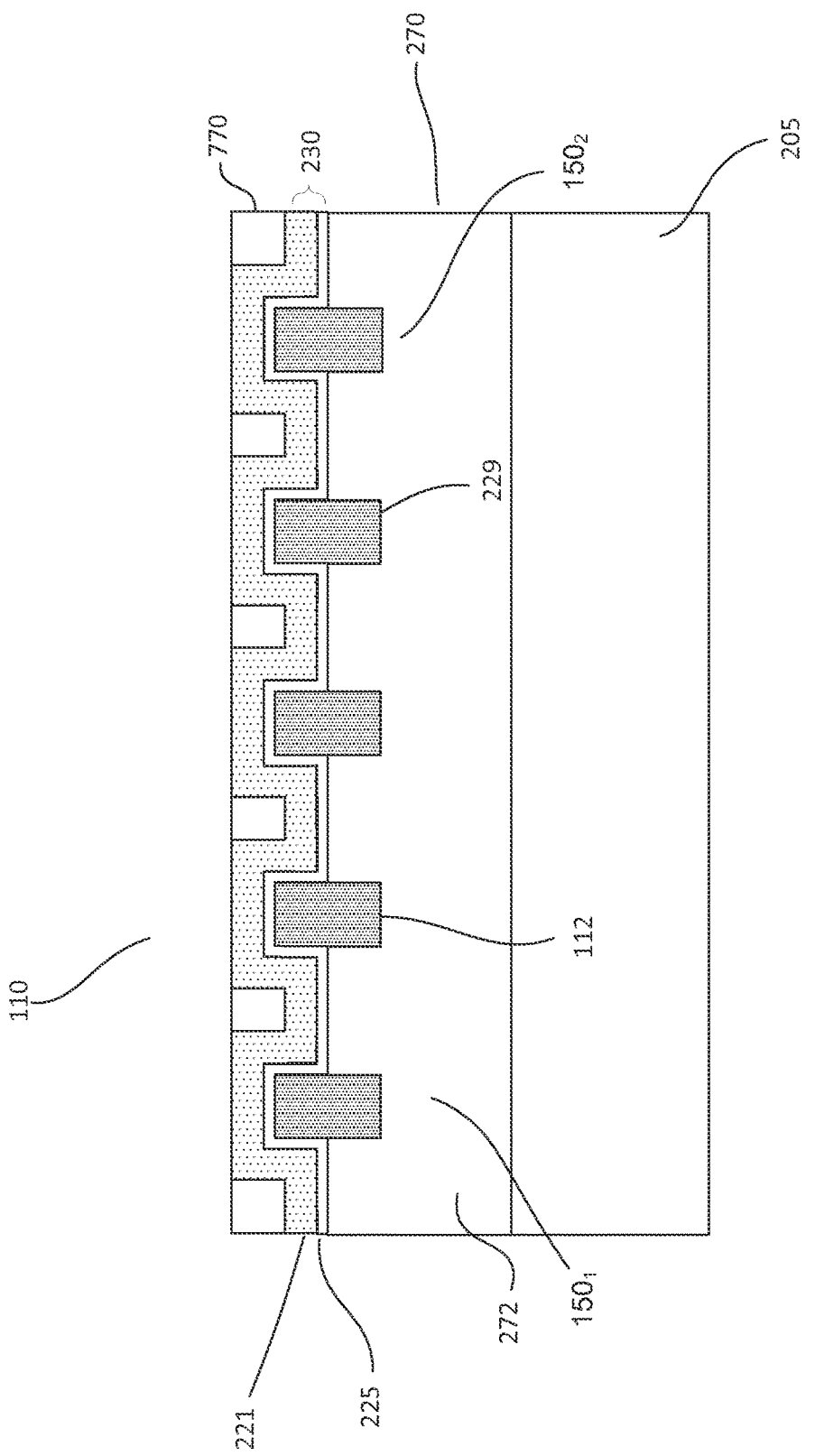

Referring to FIG. 8b, a filler dielectric layer 770 is formed on the substrate. The filler dielectric layer, for example, may be silicon oxide. For example, the filler dielectric layer may be similar to the lower cell dielectric layer. Providing a filler dielectric layer which is different from that of the lower cell dielectric layer may also be useful. The filler dielectric layer fills the recesses and covers the body mesas. A planarization process, such as CMP, removes excess filler dielectric layer, leaving dielectric fills in the recesses. The dielectric fills, in one embodiment, have top surfaces which are coplanar with the top surface of the body layer.

Figure 8C:
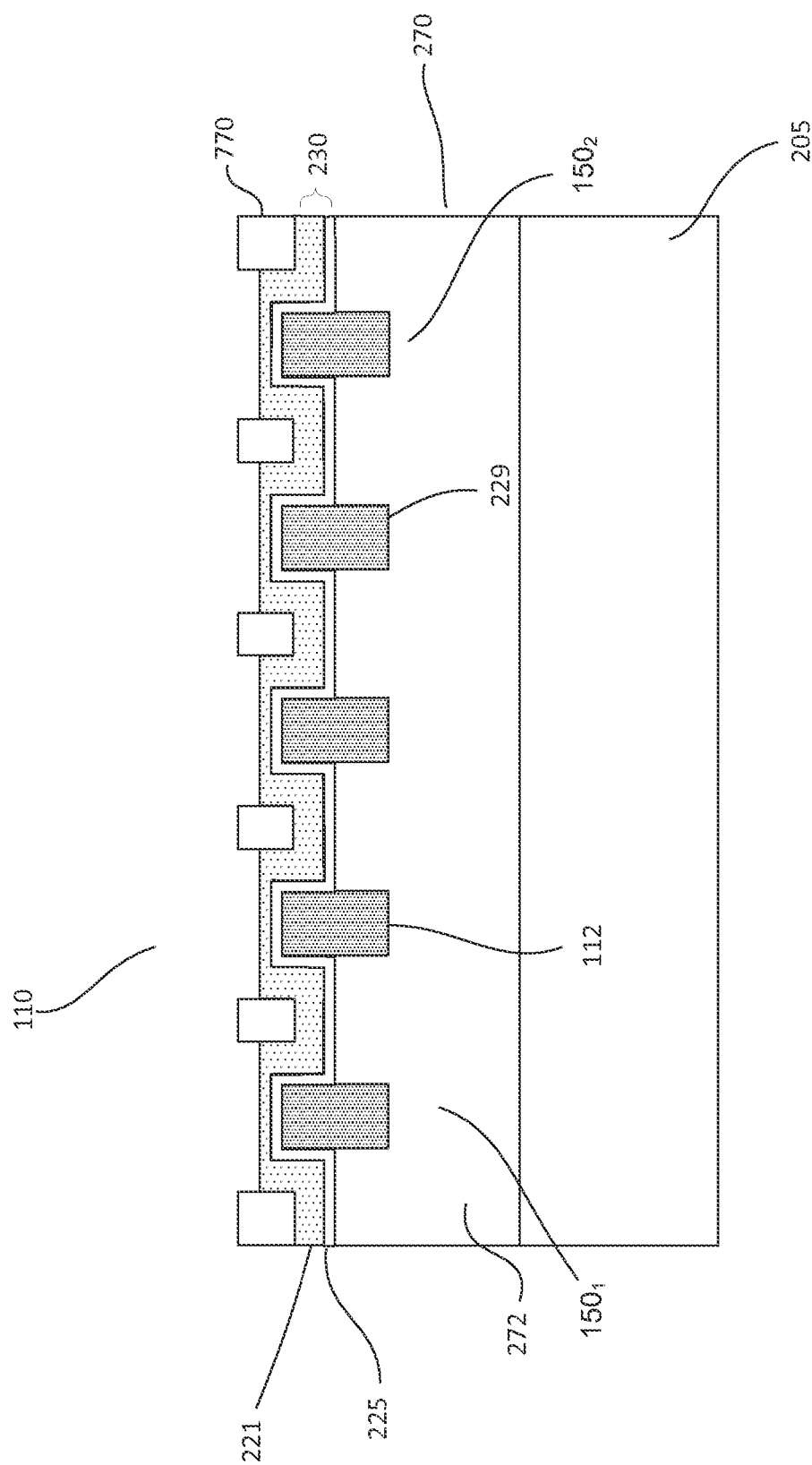

Exposed portions of the body layer in the body mesas are recessed, as shown in FIG. 8c. Recessing the exposed portions of the body layer may be achieved by an etch. For example, an isotropic etch, such as a wet etch, may be employed to recessed exposed portions of the body layer. Alternatively, an anisotropic etch may be used to recess the exposed portions of the body layer. Other techniques for recessing the exposed portions of the body layer may also be useful. The etch is sufficient to produce recesses over the body mesas having a depth equal to the desired thickness of subsequently formed storage units.

Figure 8D:
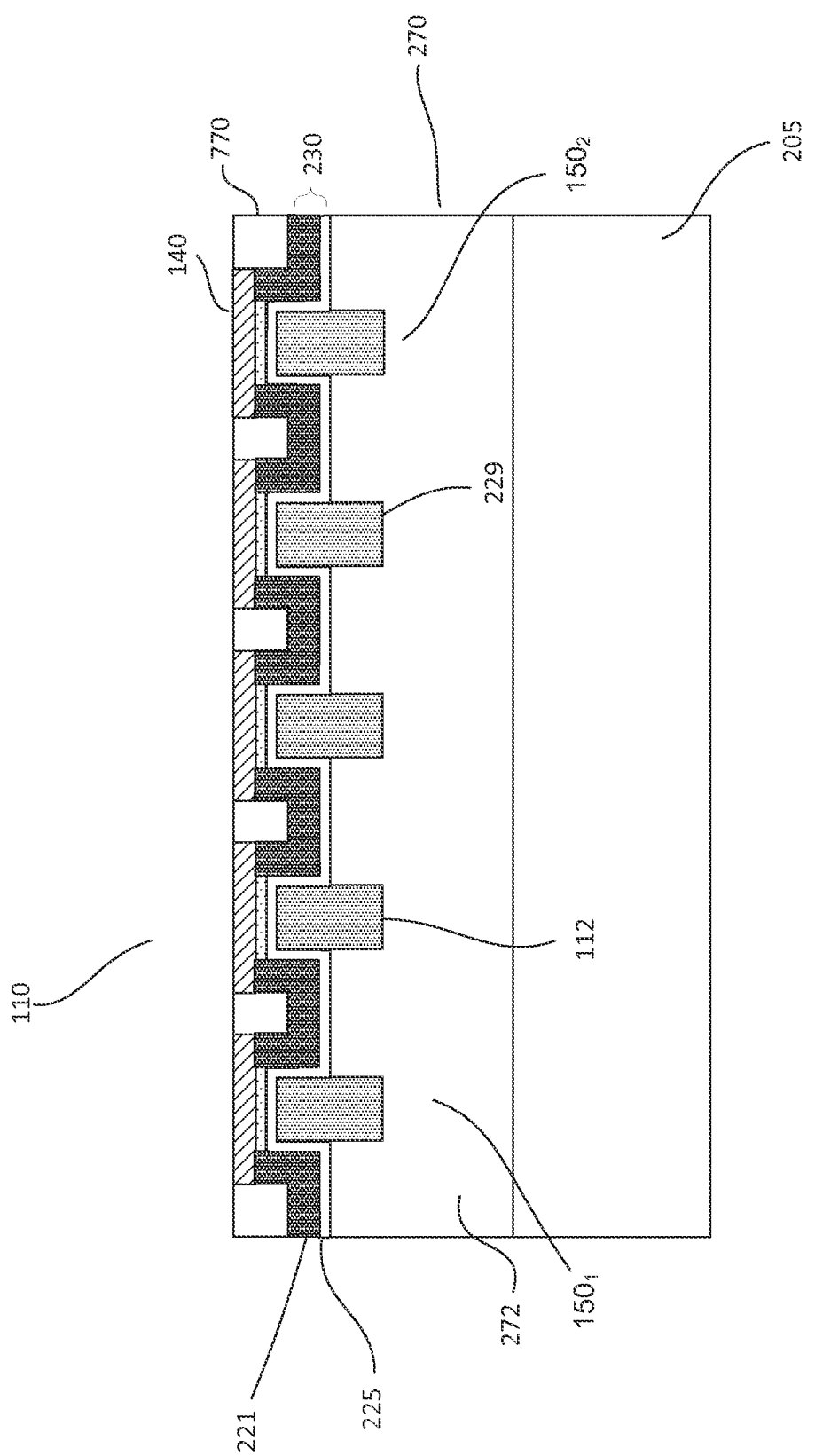

Referring to FIG. 8d, storage units are formed on the substrate, disposed in the recesses over the body mesas. The storage units, in one embodiment, are resistive storage units. In one embodiment, the resistive storage units are thermal-based resistive storage units. Alternatively, the resistive storage units are non-thermal based resistive storage units. First and second S/D regions are formed in the body layer.

Forming the storage units and S/D regions may be similar to that described in, for example, FIG. 6c. By providing recesses over the body mesas for the storage units, they are self-aligned to the select transistors.

Figure 8E:
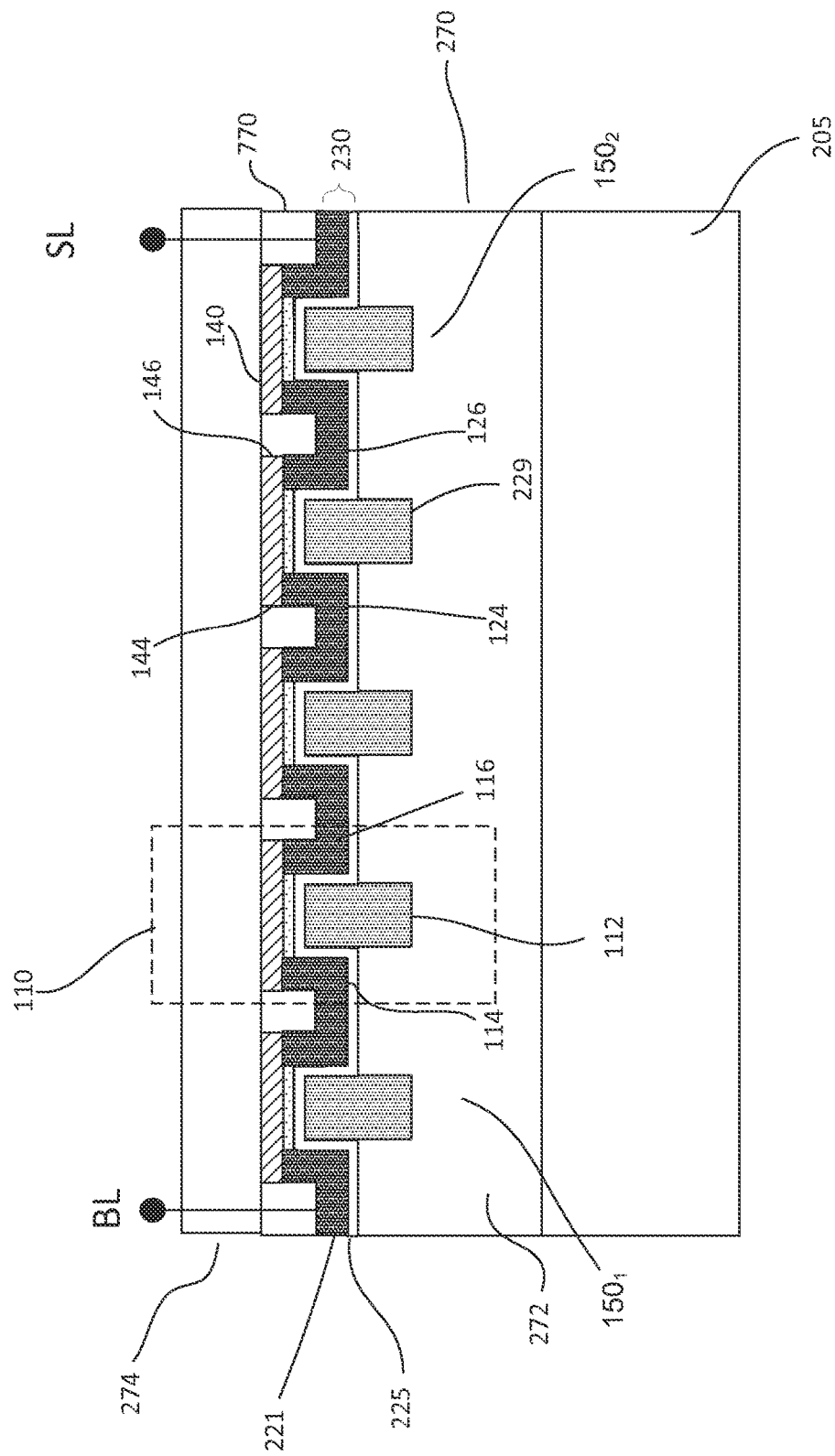

Referring to FIG. 8e, an upper cell dielectric layer 274 is formed over the substrate, covering the lower cell dielectric layer, body units and storage units. The upper cell dielectric layer, for example, is silicon oxide. Other types of cell dielectric materials may also be useful. For example, the lower cell dielectric layer may be of the same dielectric material as that used in an ILD layer of the device. The dielectric layer, for example, may be deposited by CVD. Other techniques for forming the dielectric layer may also be useful. A planarizing process may be performed. The planarizing process, for example, may include CMP. Other types of planarizing process may also be useful. The planarizing process produces a planar surface for the dielectric layer.

The process continues to form the device. The processing may include forming metal layers of the device. The metal layers include interconnections to the various components of the device, including various conductive lines coupled to the various terminals of the memory cells and column selectors. For example, the metal layers include BLs, WLs, SLs, SSLs and GSLs. Lines which are of the same direction may be formed in the same metal layer, while lines of different directions may be formed in a different metal layer. Other configurations of lines and metal layers may also be useful. Additional processing, such as silicidation, final passivation, dicing, assembly and packaging may be performed. Other processes may also be included.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a device comprising:
   providing a substrate prepared with a lower cell dielectric layer with gate conductors disposed in a first direction, wherein the gate conductors are elongated gate conductors formed in the lower cell dielectric layer and separated by the lower cell dielectric layer;
   forming a body unit conductor over a top surface of the lower cell dielectric layer and gate conductors, wherein the body unit conductor is disposed in and along a second direction orthogonal to the first direction and traverses the gate conductors;
   forming memory element conductors on the body unit conductor and lower cell dielectric layer, wherein the memory element conductors are elongated memory element conductors disposed in and along the same first direction over the gate conductors; and
   forming an upper cell dielectric layer on the substrate to cover the lower cell dielectric layer, body unit conductor and memory element conductors, wherein the upper cell dielectric layer isolates the memory element conductors from each other.

2. The method of claim 1 wherein the gate conductors have a planar surface with the lower cell dielectric layer.

3. The method of claim 1 wherein:
   the gate conductors have a top surface disposed over a top surface of the lower cell dielectric layer, creating gate conductor mesas;
   the body unit conductor is disposed on the gate conductor mesas, creating body mesas; and
   forming memory element conductors on the body mesas.

4. The method of claim 1 wherein:
the gate conductors have a top surface disposed below a top surface of the lower cell dielectric layer, creating gate conductor recesses;
the body unit conductor is disposed on the lower cell dielectric layer and lines the gate conductor recesses, creating body recesses; and
the memory element conductors are disposed in the body recesses.

5. The method of claim 1 wherein the memory element conductors comprise resistive memory element conductors.

6. The method of claim 5 wherein the resistive memory element conductors comprise phase change memory element conductors.

7. The method of claim 5 wherein the memory element conductors comprise non-thermal resistive memory element conductors.

8. The method of claim 1 wherein the body unit conductor comprises:
a gate dielectric layer; and
a body layer to serve as bodies of transistors of a column of memory cells.

9. The method of claim 8 wherein:
the gate dielectric layer serves as a common gate dielectric layer of columns of memory cells; and
the body layer comprises silicon.

10. The method of claim 1 wherein:
the body unit conductor comprises a transistor body layer and a gate dielectric layer, wherein first and second source/drain (S/D) regions and channel regions of cell select transistors are disposed in the transistor body layer; and
each of the memory element conductors comprises first and second storage terminals, wherein the first S/D region of a cell select transistor is coupled to and in direct contact with the first storage terminal while the second S/D region of the cell select transistor is coupled to and in direct contact with the second storage terminal of the memory element conductor.

11. The method of claim 1 comprising:
patterning the lower cell dielectric layer to form trenches, wherein the trenches are elongated trenches disposed along the first direction and the trenches extend from the top surface of the lower cell dielectric layer and partially into the lower cell dielectric layer such that bottom of the trenches is above a bottom surface of the lower cell dielectric layer;
forming a gate electrode layer over the substrate and fills the trenches; and
removing excess gate electrode layer, leaving the gate conductors in the trenches.

12. The method of claim 1 wherein forming the body unit conductor on the lower cell dielectric layer and gate conductors comprises:
forming body unit layers which comprise a gate dielectric layer and a body layer over the lower cell dielectric layer; and
patterning the body unit layers to form the body unit conductor which is an elongated member disposed in and along the second direction and traverses the gate conductors.

13. The method of claim 12 wherein forming the memory element conductors comprises:
depositing a storage element layer on the substrate, covering the lower cell dielectric layer and body unit conductor; and
patterning the storage element layer to form the elongated memory element conductors disposed in and along the same first direction.

14. The method of claim 13 wherein patterning the storage element layer forms the elongated memory element conductors that have a width which is wider than a width of the elongated gate conductors.

15. The method of claim 13 comprising forming first and second source/drain (S/D) regions in the body layer by ion implantation, wherein the S/D regions are formed adjacent to sides of the gate conductors and the memory element conductors, and wherein the implantation is self-aligned to the memory element conductors.

16. The method of claim 15 wherein:
the gate conductor and S/D regions formed in the body layer adjacent to first and second sides of the gate conductor correspond to a cell select transistor of a memory cell;
the memory element conductor corresponds to a storage unit of the memory cell.

17. The method of claim 16 comprising coupling a column of memory cells disposed along the second direction in between first and second column selectors, wherein the first and second column selectors comprise the same structure as the memory cell.

18. A method for forming a device comprising:
providing a substrate prepared with a lower cell dielectric layer with first type conductors disposed in and extends along a first direction, wherein the first type conductors are elongated first type conductors separated by the lower cell dielectric layer;
forming a body unit conductor over a top surface of the lower cell dielectric layer and first type conductors, wherein the body unit conductor is disposed in and extends along a second direction orthogonal to the first direction and traverses the first type conductors;
forming second type conductors on the body unit conductor and the lower cell dielectric layer, wherein the second type conductors are elongated second type conductors disposed in and extend along a direction which is parallel to the first direction over the first type conductors, wherein the first and second type conductors directly contact the body unit conductor; and
forming an upper cell dielectric layer on the substrate to cover the lower cell dielectric layer, body unit conductor and second type conductors, wherein the upper cell dielectric layer isolates the second type conductors from each other.

19. The method of claim 18 wherein:
the first type conductors have a top surface which is coplanar with the top surface of the lower cell dielectric layer; and
the upper cell dielectric layer comprises voids formed in between adjacent second type conductors.

20. The method of claim 18 wherein:
the first type conductors have a top surface disposed over a top surface of the lower cell dielectric layer, creating first type conductor mesas;
the body unit conductor is disposed on the gate conductor mesas, creating body mesas; and
forming second type conductors on the body mesas.

21. The method of claim 18 wherein:
the first type conductors have a top surface disposed below a top surface of the lower cell dielectric layer, creating first type conductor recesses;

the body unit conductor is disposed on the lower cell dielectric layer and lines the first type conductor recesses, creating body recesses; and the second type conductors are disposed in the body recesses.

22. A method for forming a device comprising:

providing a substrate prepared with a lower cell dielectric layer with first type conductors disposed in and extends along a first direction, wherein the first type conductors are elongated first type conductors separated by the lower cell dielectric layer, wherein the first type conductors comprise gate conductors;

forming a body unit conductor over a top surface of the lower cell dielectric layer and first type conductors, wherein the body unit conductor is disposed in and extends along a second direction orthogonal to the first direction and traverses the first type conductors;

forming second type conductors on the body unit conductor and the lower cell dielectric layer, wherein the second type conductors are elongated second type conductors disposed in and extend along a direction which is parallel to the first direction over the first type conductors, wherein the second type conductors comprise memory element conductors; and forming an upper cell dielectric layer on the substrate to cover the lower cell dielectric layer, body unit conductor and second type conductors, wherein the upper cell dielectric layer isolates the second type conductors from each other.

* * * * *